United States Patent
Young et al.

(10) Patent No.: US 12,310,094 B2
(45) Date of Patent: May 20, 2025

(54) NANO-SHEET-BASED COMPLEMENTARY METAL-OXIDE-SEMICONDUCTOR DEVICES WITH ASYMMETRIC INNER SPACERS

(71) Applicant: Taiwan Semiconductor Manufacturing Co., Ltd., Hsinchu (TW)

(72) Inventors: Bo-Feng Young, Taipei (TW); Sai-Hooi Yeong, Hsinchu County (TW); Kuan-Lun Cheng, Hsin-Chu (TW); Chih-Hao Wang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 80 days.

(21) Appl. No.: 17/858,991

(22) Filed: Jul. 6, 2022

(65) Prior Publication Data

US 2022/0352036 A1 Nov. 3, 2022

Related U.S. Application Data

(62) Division of application No. 16/875,726, filed on May 15, 2020, now Pat. No. 11,476,166.

(Continued)

(51) Int. Cl.
| | |
|---|---|
| *H10D 84/03* | (2025.01) |
| *H01L 21/02* | (2006.01) |
| *H10D 30/01* | (2025.01) |
| *H10D 30/67* | (2025.01) |
| *H10D 62/10* | (2025.01) |

(Continued)

(52) U.S. Cl.
CPC ..... *H10D 84/038* (2025.01); *H01L 21/02532* (2013.01); *H01L 21/02603* (2013.01);
(Continued)

(58) Field of Classification Search
CPC .......... H01L 29/0673; H01L 29/66545; H01L 29/66553; H01L 29/66795; H01L 29/78696
See application file for complete search history.

(56) References Cited

U.S. PATENT DOCUMENTS

| | | |
|---|---|---|
| 8,772,109 B2 | 7/2014 | Colinge |
| 8,785,285 B2 | 7/2014 | Tsai et al. |

(Continued)

*Primary Examiner* — Brian Turner
(74) *Attorney, Agent, or Firm* — HAYNES AND BOONE, LLP

(57) ABSTRACT

A semiconductor device is provided. The device includes a first pair and a second pair of source/drain features over a semiconductor substrate. The first pair of source/drain features are p-type doped. The second pair of source/drain features are n-type doped. A first stack of semiconductor layers connect the first pair of source/drain features along a first direction. A second stack of semiconductor layers connect the second pair of source/drain features along a second direction. A first gate is between vertically adjacent layers of the first stack of semiconductor layers. The first gate has a first portion that has a first dimension along the first direction. A second gate is between vertically adjacent layers of the second stack of semiconductor layers. The second gate has a second portion that has a second dimension along the second direction. The second dimension is larger than the first dimension.

20 Claims, 33 Drawing Sheets

Related U.S. Application Data

(60) Provisional application No. 62/880,311, filed on Jul. 30, 2019.

(51) Int. Cl.
*H10D 64/01* (2025.01)
*H10D 84/01* (2025.01)
*H10D 84/85* (2025.01)

(52) U.S. Cl.
CPC ....... *H10D 30/031* (2025.01); *H10D 30/6713* (2025.01); *H10D 30/6735* (2025.01); *H10D 30/6757* (2025.01); *H10D 62/121* (2025.01); *H10D 64/017* (2025.01); *H10D 64/018* (2025.01); *H10D 84/0167* (2025.01); *H10D 84/017* (2025.01); *H10D 84/0172* (2025.01); *H10D 84/0184* (2025.01); *H10D 84/85* (2025.01)

(56) References Cited

U.S. PATENT DOCUMENTS

| | | |
|---|---|---|
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 2015/0228788 A1* | 8/2015 | Chen ................ H01L 29/66545 257/288 |
| 2017/0110554 A1* | 4/2017 | Tak ................ H01L 29/42392 |
| 2017/0338326 A1* | 11/2017 | Ching ................ H01L 29/24 |
| 2018/0158836 A1 | 6/2018 | Kim |
| 2018/0175035 A1 | 6/2018 | Yang |
| 2018/0315667 A1 | 11/2018 | Kwon |
| 2019/0181257 A1 | 6/2019 | Jeong |
| 2019/0198639 A1 | 6/2019 | Kim |
| 2019/0214314 A1* | 7/2019 | Seo ................ H01L 29/78696 |
| 2019/0287864 A1* | 9/2019 | Cheng ............ H01L 21/823468 |
| 2019/0295899 A1* | 9/2019 | Seo ................ H01L 27/092 |
| 2019/0305104 A1* | 10/2019 | Xie ................ H01L 29/4908 |
| 2019/0341450 A1* | 11/2019 | Lee ................ H01L 21/823864 |
| 2019/0355723 A1* | 11/2019 | Miao ................ H01L 29/78684 |
| 2020/0051981 A1 | 2/2020 | Yang |
| 2020/0066508 A1* | 2/2020 | Doris ................ H01L 29/66545 |
| 2020/0203481 A1* | 6/2020 | Thareja ............ H01L 29/1087 |
| 2020/0312956 A1 | 10/2020 | Yeh |

* cited by examiner

NANO-SHEET-BASED COMPLEMENTARY METAL-OXIDE-SEMICONDUCTOR DEVICES WITH ASYMMETRIC INNER SPACERS

CROSS-REFERENCE TO RELATED APPLICATIONS

This application is a divisional application of U.S. patent application Ser. No. 16/875,726, filed May 15, 2020, which claims priority to U.S. Provisional Patent Application Ser. No. 62/880,311 filed on Jul. 30, 2019, each of which is hereby incorporated herein by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing, and for these advancements to be realized, similar developments in IC processing and manufacturing are needed.

For example, multi-gate devices have been introduced in an effort to improve gate control by increasing gate-channel coupling, reduce OFF-state current, and reduce short-channel effects (SCEs). One such multi-gate device is nano-sheet-based transistor, whose gate structure extends around its channel region providing access to the channel region on all sides. The nano-sheet-based transistors are compatible with conventional complementary metal-oxide-semiconductor (CMOS) processes, allowing them to be aggressively scaled down while maintaining gate control and mitigating SCEs. However, conventional methods for nano-sheet-based transistors may experience challenges in separately tuning current flow and capacitances of different device regions thereby falling short of achieving overall balanced and optimized performance. Therefore, although conventional nano-sheet-based transistors have been generally adequate for their intended purposes, they are not satisfactory in every respect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1B:
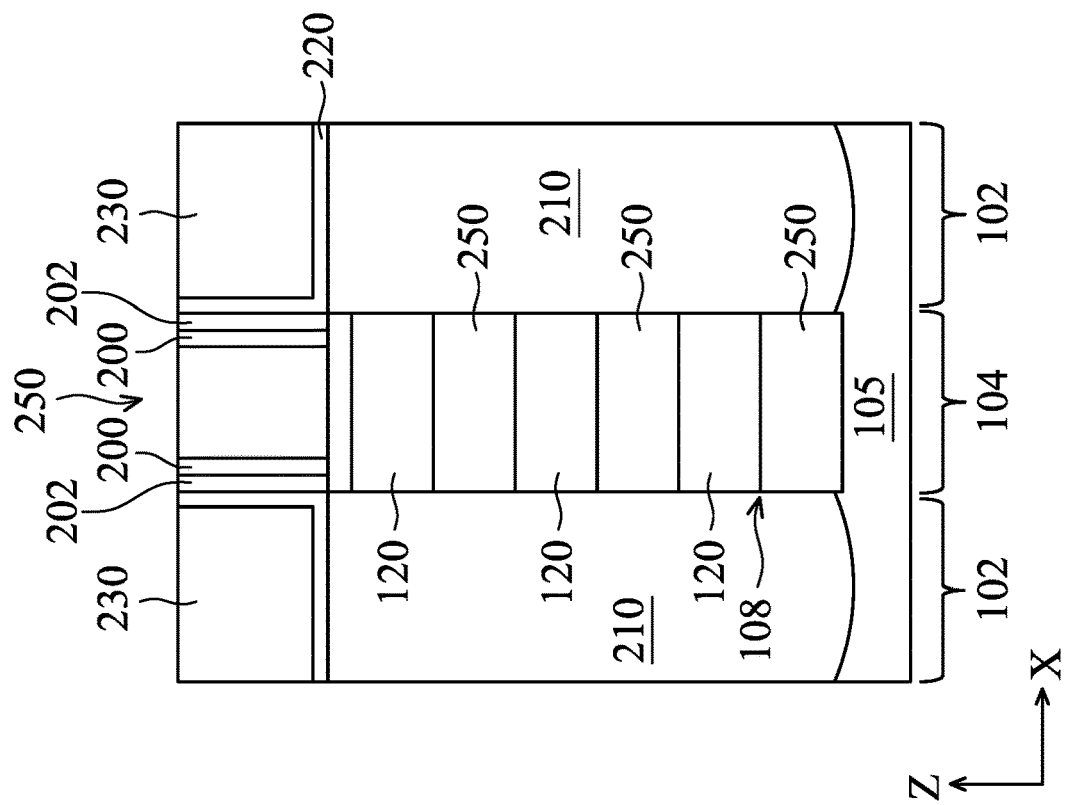
FIG. 1B is a cross-sectional view of an embodiment of a nano-sheet-based transistor that may be implemented as a PMOS and/or an NMOS in embodiments of nano-sheet-based CMOS devices of the present disclosure along the line A-A' in FIG. 1A constructed according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" may encompass the dimension range from 4.5 nm to 5.5 nm.

The present disclosure is generally related to ICs and semiconductor devices and methods of forming the same. More particularly, the present disclosure is related to complementary metal-oxide-semiconductor (CMOS) device. CMOS is a type of semiconductor device that uses a combination of p-type transistors (PMOS) and n-type transistors (NMOS) to implement logic gates and other circuits. CMOS technology is used for constructing microprocessors, memory chips, microcontrollers, among others. As technologies progress towards smaller technology nodes (for example, 20 nm, 16 nm, 10 nm, 7 nm, 5 nm, and below), the optimization of CMOS performance increasingly hinges on reducing chip footprint and balancing performance characteristics of PMOS and NMOS transistors. As a result, nano-sheet-based transistors have become a popular and promising architecture for building CMOS devices. The present disclosure provides methods of fabricating nano-sheet-based CMOS transistors. Particularly, the methods of the present disclosure decouple the fabrications of PMOS and NMOS transistors such that these different types of devices may be separately tuned for the optimal overall performance of the nano-sheet-based CMOS devices. For example, inner spacers of the PMOS and NMOS transistors of the present disclosure are made to have different physical dimensions, different surface profiles, and/or different material compositions such that the performance of the PMOS and NMOS devices can be separately tuned.

A nano-sheet-based device includes any device that has a plurality of suspended gate channel layers stacked together to form the gate structure. Nano-sheet-based devices include gate-all-around (GAA) devices, multi-bridge-channel (MBC) devices, and other similar devices. Furthermore, the nano-sheet-based devices may include gate channel layers of any suitable shapes and/or configurations. For example, the gate channel layers may be in one of many different shapes, such as wire (or nanowire), sheet (or nanosheet), bar (or nano-bar), and/or other suitable shapes. In other words, the term nano-sheet-based devices broadly encompasses devices having gate channel layers in nanowire, nano-bars, and any suitable shapes. One of ordinary skill may recognize other examples of semiconductor devices that may benefit from aspects of the present disclosure. For example, other types of metal-oxide semiconductor field effect transistors (MOSFETs), such as planar MOSFETs, FinFETs, other multi-gate FETs may benefit from the present disclosure.

Figure 1A:
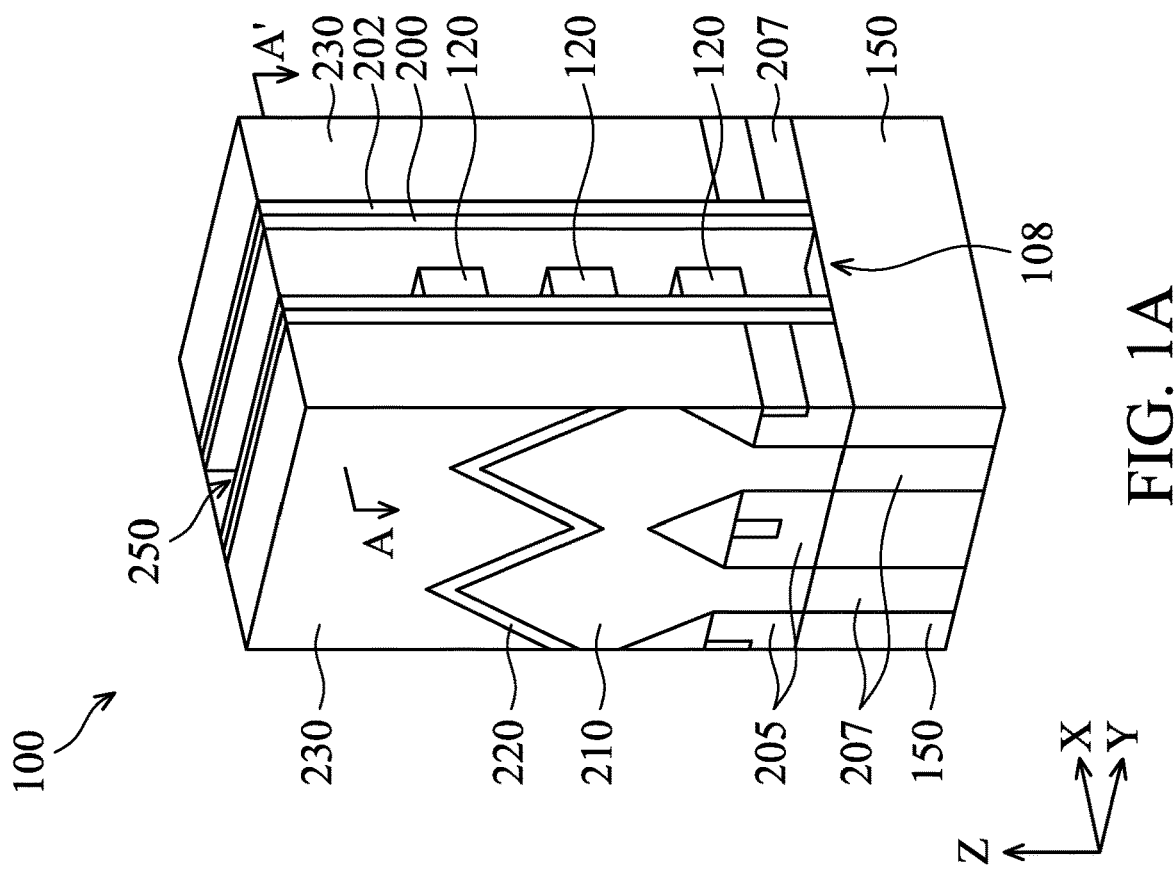
FIG. 1A is a three-dimensional (3D) perspective view of an embodiment of a nano-sheet-based transistor that may be implemented as a PMOS and/or an NMOS in embodiments of nano-sheet-based CMOS devices of the present disclosure constructed according to some embodiments of the present disclosure.

An exemplary nano-sheet-based transistor 100 is illustrated in FIGS. 1A and 1B. FIG. 1A is a three-dimensional (3D) perspective view of an embodiment of a nano-sheet-based transistor that may be implemented as a PMOS and/or an NMOS transistor in embodiments of nano-sheet-based CMOS devices of the present disclosure. FIG. 1B is a cross-sectional view of the nano-sheet-based transistor in FIG. 1A along the line A-A'. As illustrated, the nano-sheet-based transistor 100 includes a semiconductor substrate 105. Fin structures (or fins), such as fin structures 108, are formed over the substrate 105, each extending lengthwise horizontally in an X-direction and separated from each other horizontally in a Y-direction. It is understood that the X-direction and the Y-direction are horizontal directions that are perpendicular to each other, and that the Z-direction is a vertical direction that is orthogonal (or normal) to a horizontal XY plane defined by the X-direction and the Y-direction. The semiconductor substrate 105 may have its top surface parallel to the XY plane.

The fin structures 108 each have a source region, a drain region (collectively, source/drain regions 102, or, source and drain regions 102) disposed along the X-direction and spaced away from each other. Epitaxial source/drain features 210 are formed in the source/drain regions 102. The fin structures 108 each further have a channel region 104 disposed between and connecting the source and drain regions 102. A stack of suspended semiconductor layers 120 (also referred to as "channel layers 120") are formed in the channel region 104 connecting the epitaxial source/drain features 210; and the stack extends vertically (e.g. along the Z-direction) from the substrate 105. The suspended semiconductor layers 120 may each be in one of many different shapes, such as wire (or nanowire), sheet (or nanosheet), bar (or nano-bar), and/or other suitable shapes, and may be spaced away from each other. In the depicted embodiments, there are three semiconductor layers 120 in the stack. However, there may be any appropriate number of layers in the stack, such as 2 to 10 layers. The semiconductor layers 120 may each engage with a single, contiguous gate structure 250. Note that the gate structure 250 is illustrated as a transparent feature in FIG. 1A in order to illustrate the features (such as the semiconductor layers 120) that the gate structure 250 covers.

The nano-sheet-based transistor 100 further includes isolation features 150 within and/or over the substrate 105, separating adjacent fin structures from each other. The isolation features 150 may be shallow trench isolation (STI) features. In some examples, the formation of the isolation features 150 includes etching trenches into the substrate 105 between the active regions (the regions in which the fin structures are formed) and filling the trenches with one or more dielectric materials such as silicon oxide, silicon nitride, silicon oxynitride, other suitable materials, or combinations thereof. Any appropriate methods, such as a chemical vapor deposition (CVD) process, an atomic layer deposition (ALD) process, a physical vapor deposition (PVD) process, a plasma-enhanced CVD (PECVD) process, a plasma-enhanced ALD (PEALD) process, and/or combinations thereof may be used for depositing the isolation features 150. The isolation features 150 may have a multi-layer structure such as a thermal oxide liner layer over the substrate 105 and a filling layer (e.g., silicon nitride or silicon oxide) over the thermal oxide liner layer. Alternatively, the isolation features 150 may be formed using any other isolation technologies. As illustrated in FIG. 1A, the fin structure 108 is located above the top surface of the isolation features 150. The nano-sheet-based transistor 100 further includes gate spacer layers 200 on both sides of the gate structure 250; optionally gate spacer layers 202 on two sides of the gate spacer layers 200; optionally contact etch stop layers 220 over the epitaxial source/drain features 210; interlayer dielectric (ILD) layer 230 over the epitaxial source/drain features 210 (and over the contact etch stop layers 220, if present); and optionally source/drain spacers 207 over the isolation features 150.

Figure 2A:
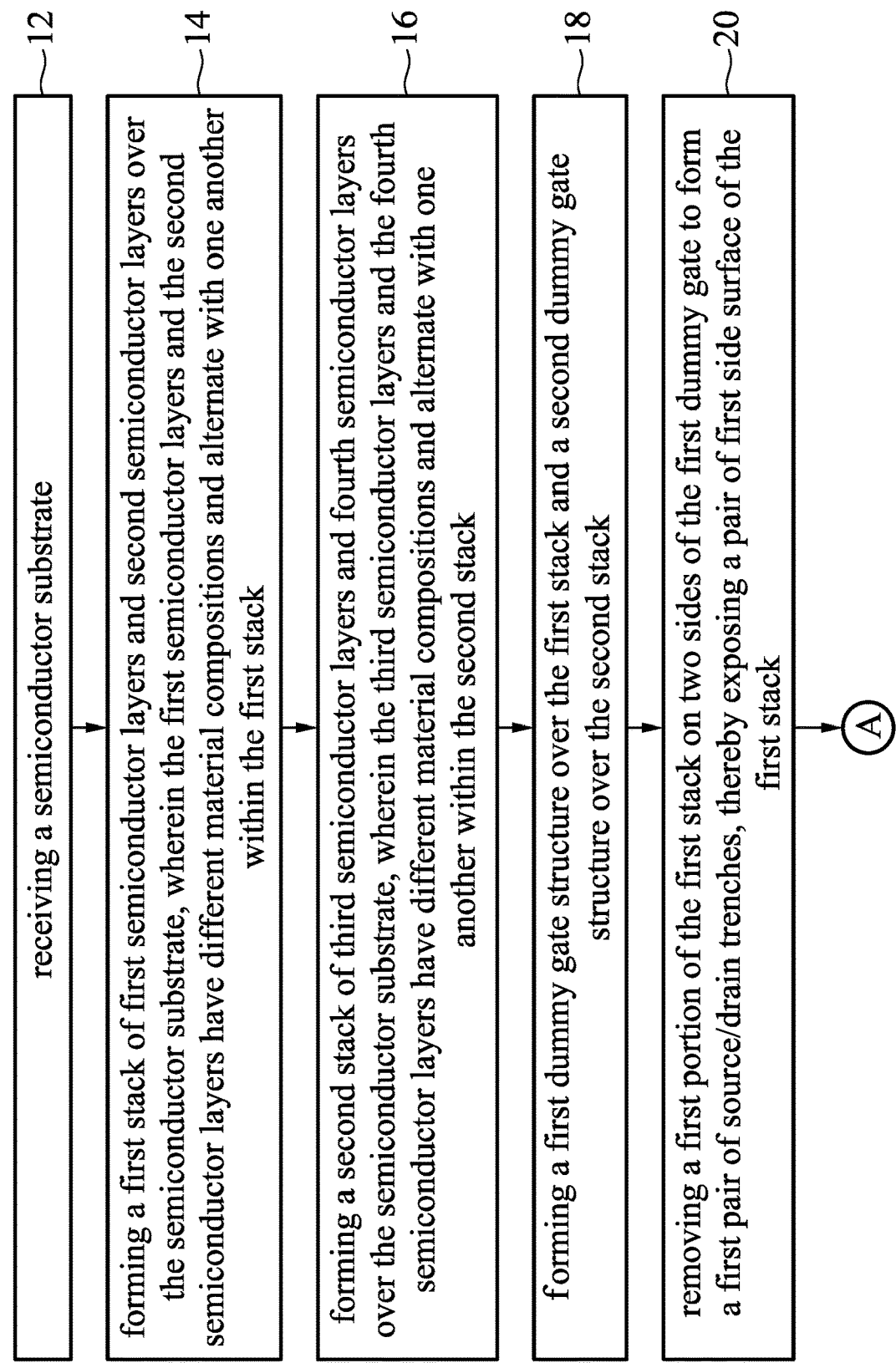
FIGS. 2A-2D are flow charts of embodiments of methods for fabricating nano-sheet-based CMOS devices of the present disclosure according to some embodiments of the present disclosure.
Figure 2B:
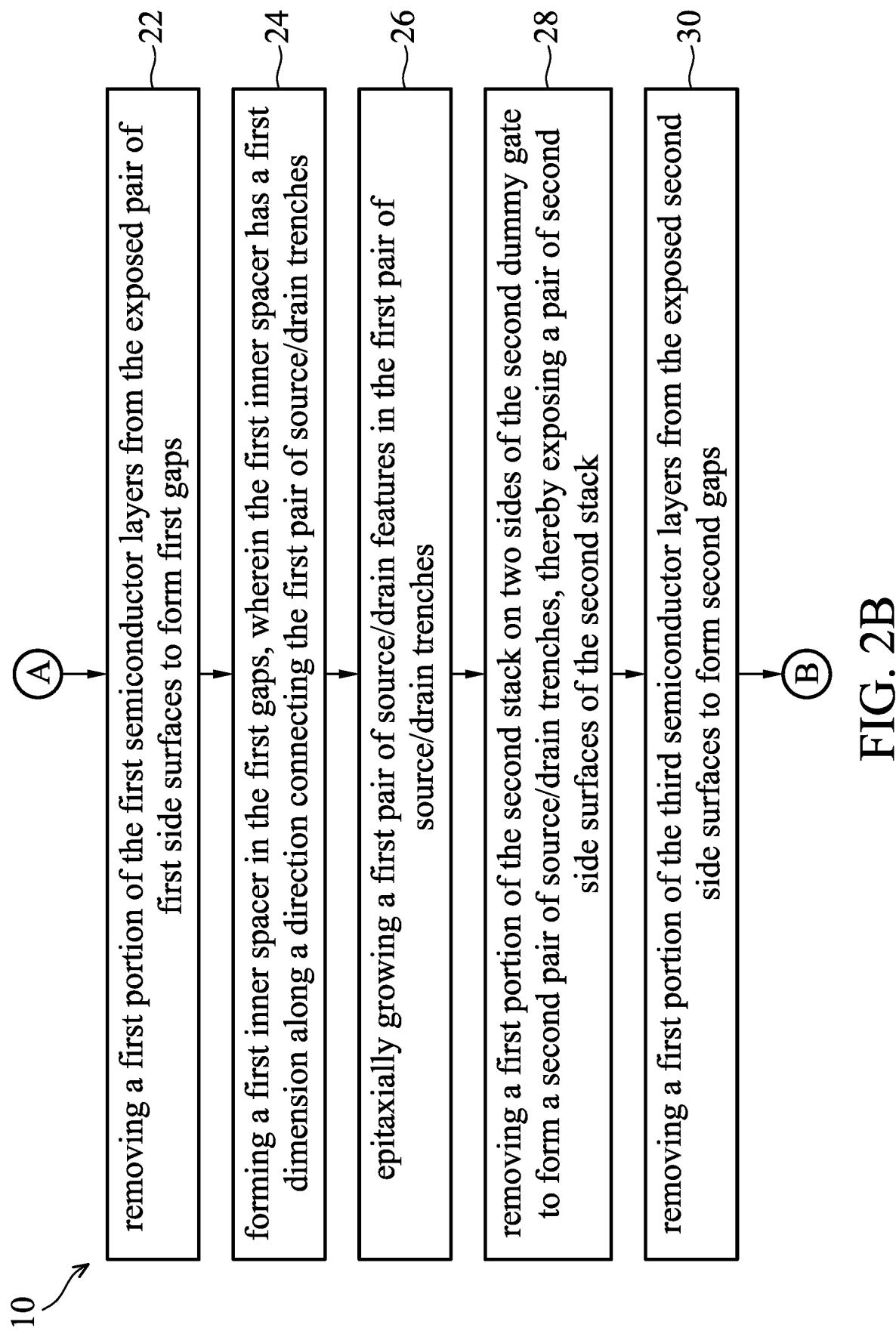
Figure 2C:
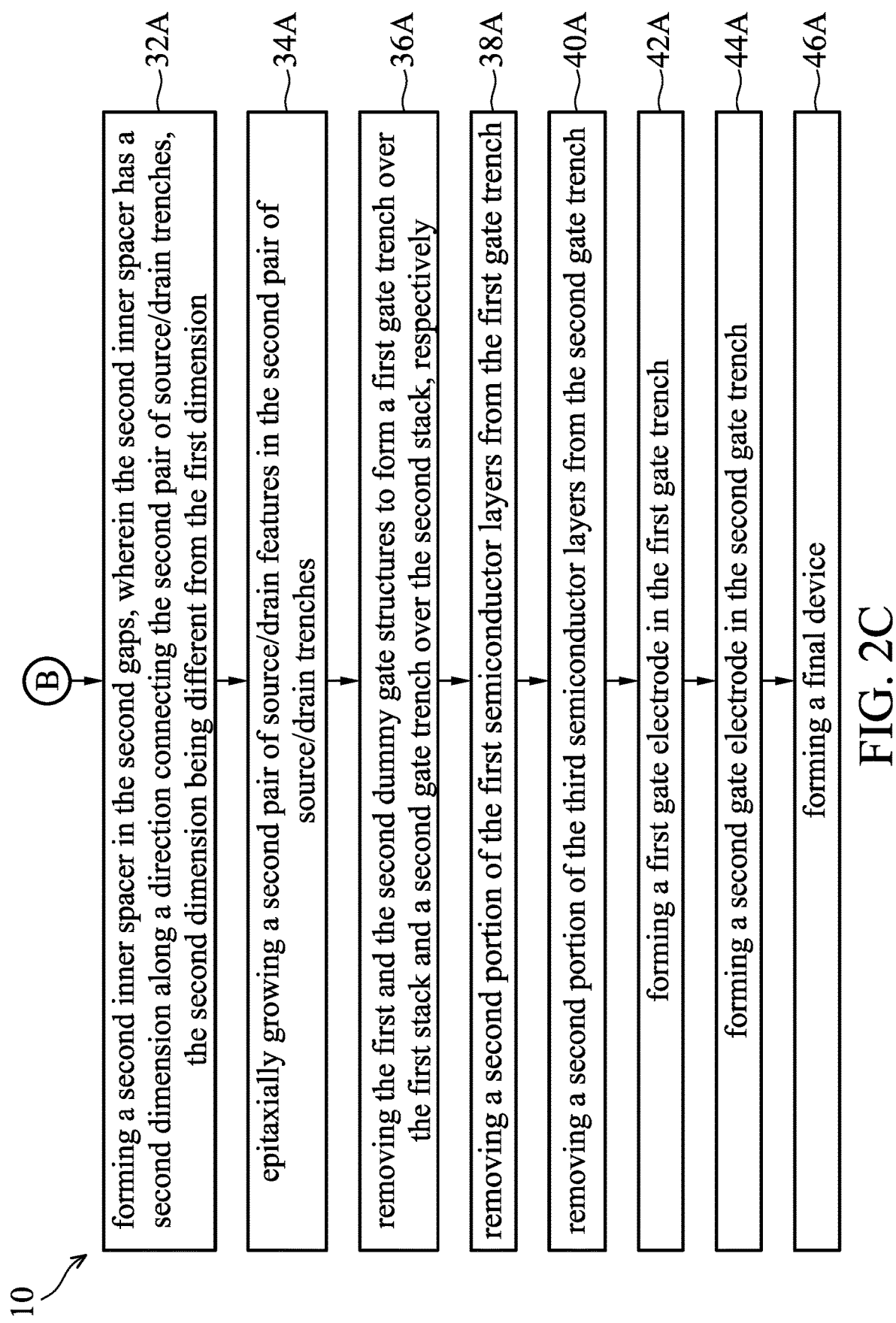
Figure 2D:
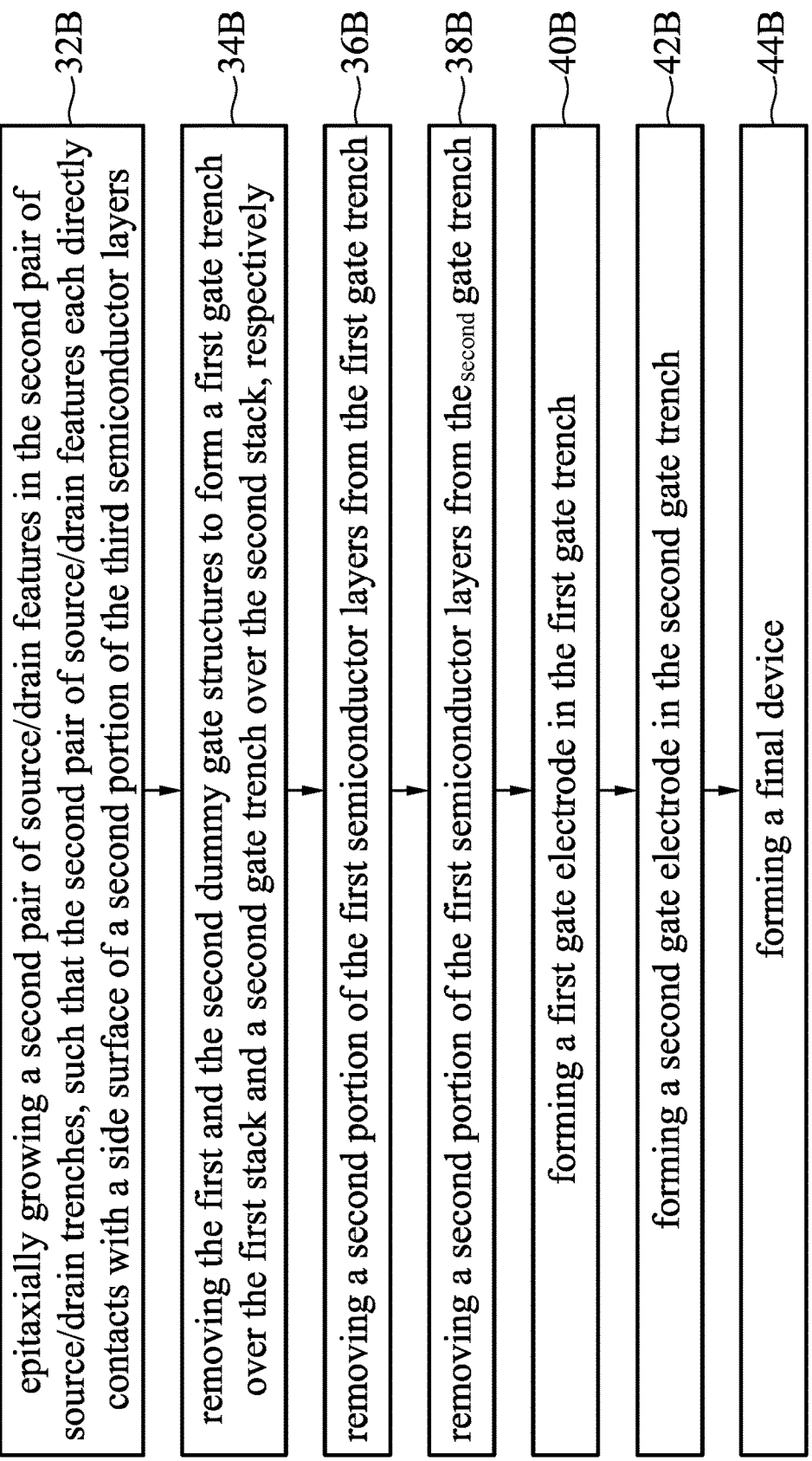

FIGS. 2A-2D are flow charts illustrating two embodiments of a method 10 for fabricating a nano-sheet-based CMOS device of the present disclosure according to some embodiments of the present disclosure. The first embodiment of method 10 (denoted as embodiment 10A) and the second embodiment of method 10 (denoted as embodiment 10B) share the same processing steps 12-30, illustrated in FIGS. 2A and 2B. The embodiment 10A continues from step (or block) 30 to 32A and through 46A, as illustrated in FIG. 2C. The embodiment 10B continues from step (or block) 30 to 32B and through 44B, as illustrated in FIG. 2D. FIGS. 3-20, 21A, and 21B are cross-sectional views of a nano-sheet-based CMOS device along the line A-A' in FIG. 1A constructed at various fabrication stages according to the embodiment 10A of method 10; and FIGS. 22-27, 28A, and 28B are cross-sectional views of a nano-sheet-based CMOS device along the line A-A' in FIG. 1A constructed at various fabrication stages according to the embodiment 10B of method 10.

Figure 3:
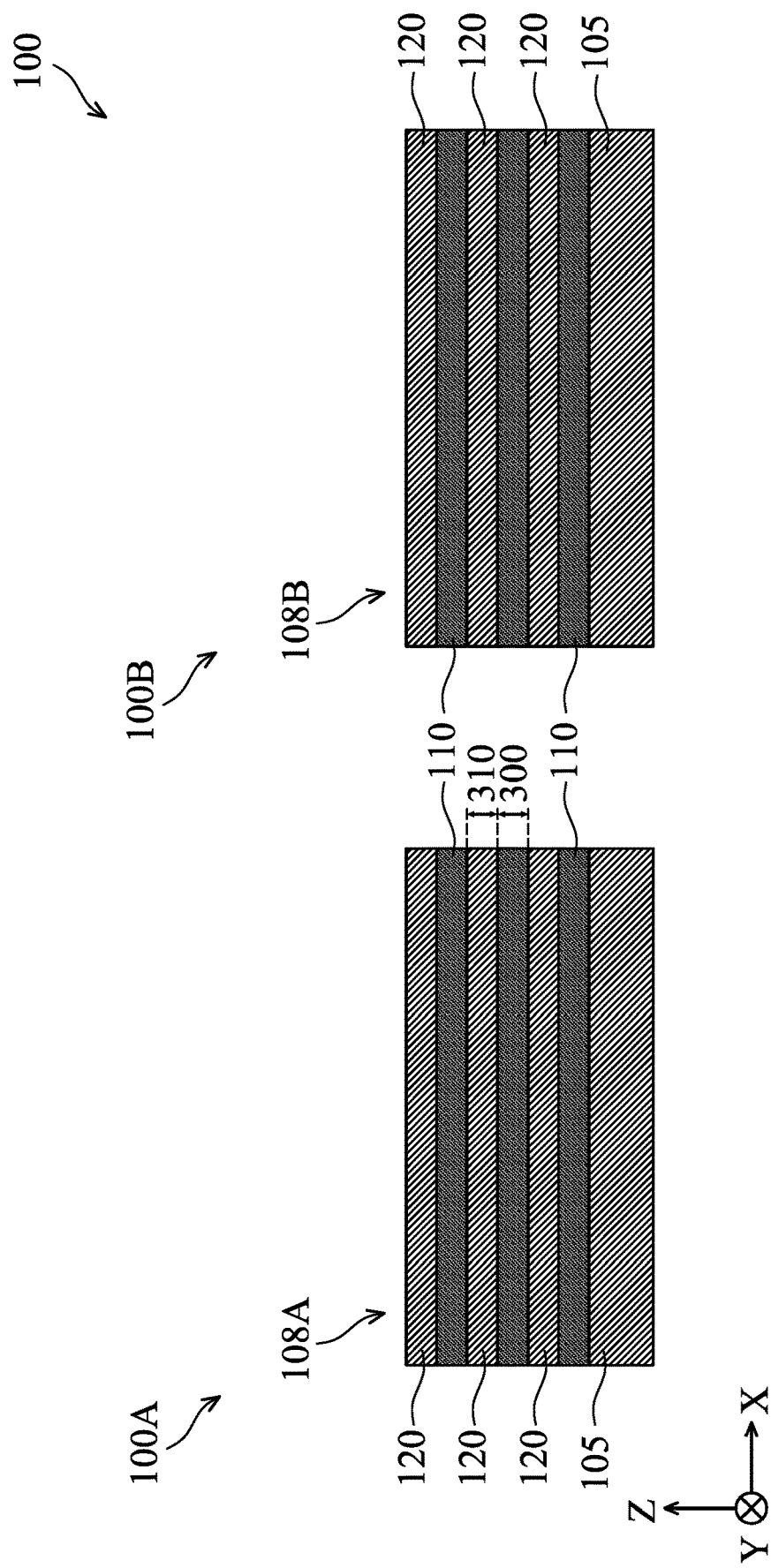
FIGS. 3, 4, 5, 6, 7, 8, 9, 10, 11, 12, 13, 14, 15, 16, 17, 18, 19, 20, 21A, 21B, 22, 23, 24, 25, 26, 27, 28A, and 28B are cross-sectional views of an embodiment of a PMOS and an embodiment of an NMOS in embodiments of nano-sheet-based CMOS devices of the present disclosure along the line A-A' in FIG. 1A constructed at various fabrication stages according to some embodiments of the present disclosure.

Referring to block 12 of FIG. 2A and FIG. 3, the nano-sheet-based CMOS includes a substrate 105. The substrate 105 contains a semiconductor material, such as bulk silicon (Si), germanium (Ge), silicon germanium (SiGe), silicon carbide (SiC), gallium arsenic (GaAs), gallium phosphide (GaP), indium phosphide (InP), indium arsenide (InAs), and/or indium antimonide (InSb), or combinations thereof. The substrate 105 may also include a semiconductor-oninsulator substrate, such as Si-on-insulator (SOI), SiGe-on-insulator (SGOI), Ge-on-insulator (GOI) substrates. Some regions of the substrate 105 may be doped. For example, a region configured for a PMOS transistor of the nano-sheet-based CMOS (such as PMOS transistor 100A) may be doped with n-type dopants, such as phosphorus (P) and/or arsenic (As); a region configured for an NMOS transistor of the nano-sheet-based CMOS (such as NMOS transistor 100B) may be doped with p-type dopants, such as boron (B) and/or boron fluoride ($BF_3$). The doped regions may be formed directly on the substrate 105, in a p-well structure, in an n-well structure, in a dual-well structure, or using a raised structure.

Referring to blocks 14 and 16 of FIG. 2A and FIG. 3, stacks of semiconductor layers are formed over the substrate 105 to later form the PMOS transistor 100A and the NMOS transistor 100B. The stacks of semiconductor layers include semiconductor layers 110 and semiconductor layers 120 alternating with each other. For example, a semiconductor layer 110 is formed over the substrate 105; a semiconductor layer 120 is formed over the semiconductor layer 110; and another semiconductor layer 110 is formed over the semiconductor layer 120, so on and so forth. The material compositions of the semiconductor layers 110 and 120 are configured such that they have an etching selectivity in a subsequent etching process. For example, in some embodiments, the semiconductor layers 110 contain silicon germanium (SiGe), while the semiconductor layers 120 contain silicon (Si). In some other embodiments, the semiconductor layers 120 contain SiGe, while the semiconductor layers 110 contain Si. In the depicted embodiment, the semiconductor layers 110 each have a substantially uniform thickness, referred to as the thickness 300, while the semiconductor layers 120 each have a substantially uniform thickness, referred to as the thickness 310. The thickness 310 may be the same as, or different from, the thickness 300.

The stacks of semiconductor layers are patterned into a plurality of fin structures, for example, fin structures 108A and 108B, such that they each extend along the X-direction. The fin structures 108A and 108B may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins. The patterning may utilize multiple etching processes which may include a dry etching and/or wet etching. The fin structures 108A and 108B may have lateral widths (not shown) along the Y-direction that are the same between each other or different from each other.

Figure 4:
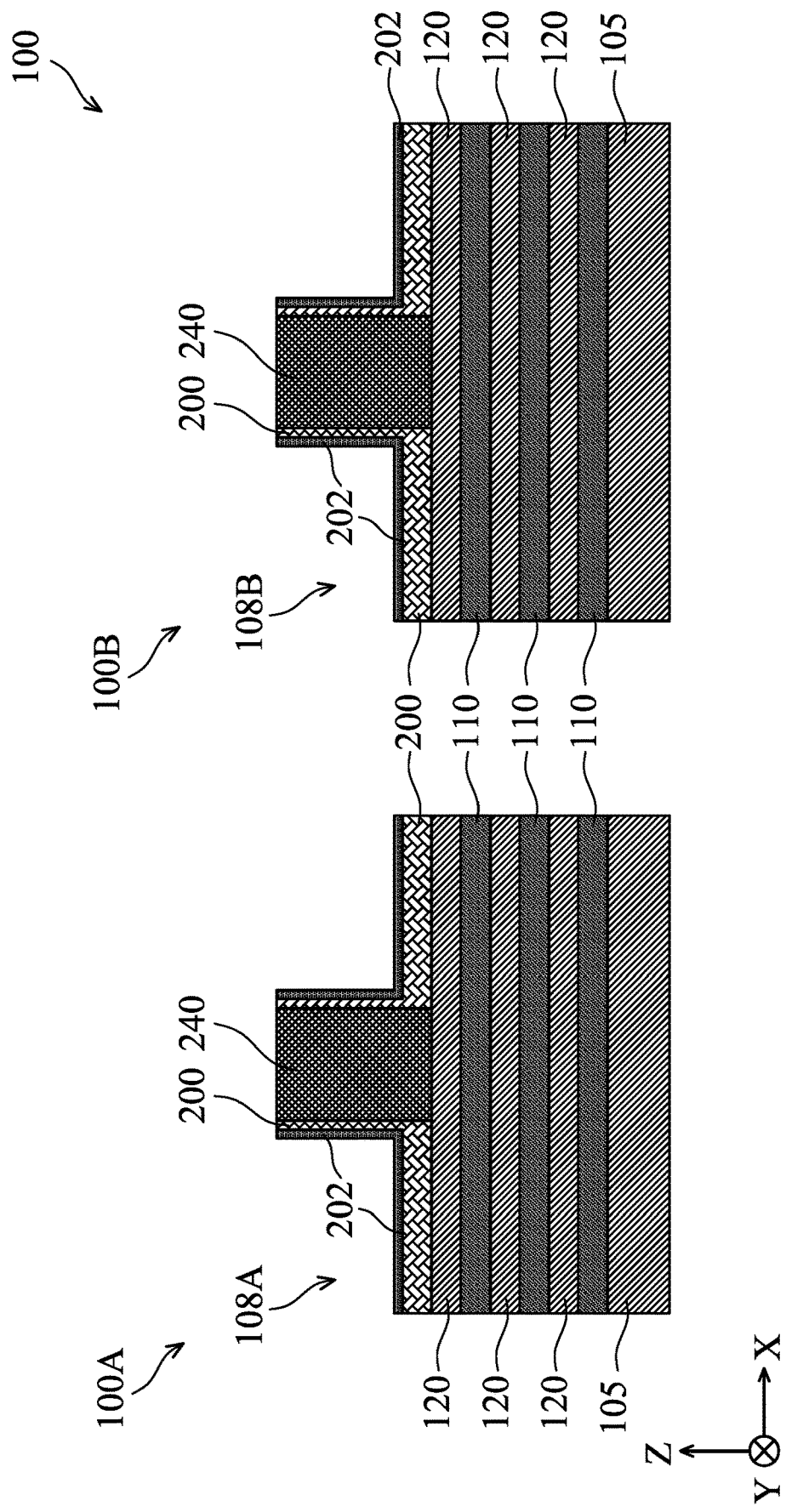
Figure 5:
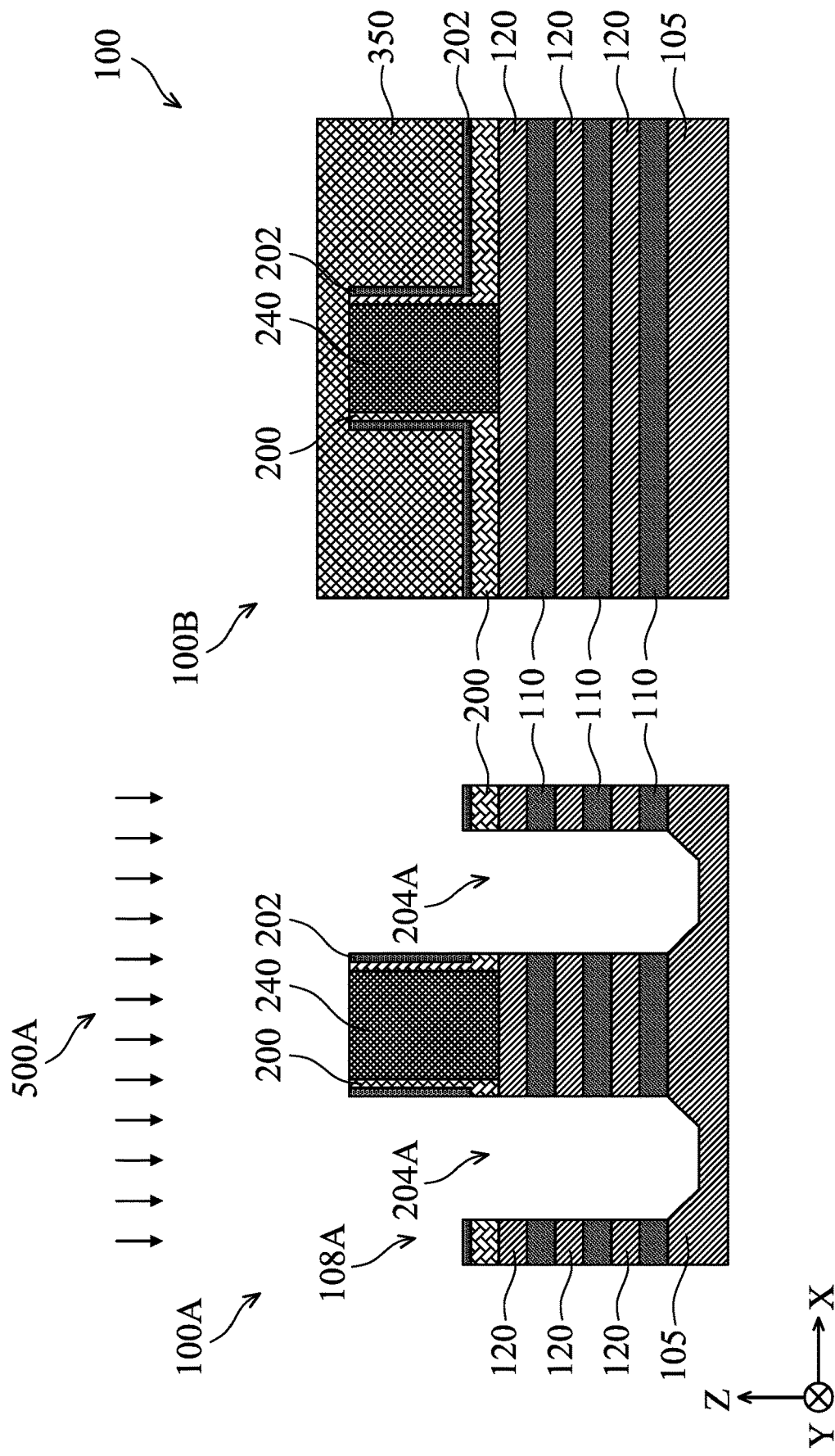

Referring to block 18 of FIG. 2A and FIG. 4, dummy gate structures 240 are formed over a portion of each of the fin structures 108A and 108B. In some embodiments, the dummy gate structures are also formed over the isolation features 150 in between adjacent fin structures. The dummy gate structures 240 may be configured to extend lengthwise in parallel to each other, for example, each along the Y-direction. In some embodiments, the dummy gate structures each wrap around the top surface and side surfaces of each of the fin structures 108A and 108B. The dummy gate structures 240 may include polysilicon. In some embodiments, the dummy gate structures 240 also include one or more mask layers (not shown), which are used to pattern the dummy gate electrode layers. The dummy gate structures 240 may undergo a gate replacement process through subsequent processing to form metal gates, such as a high-k metal gate, as discussed in greater detail below. The dummy gate structures 240 may be formed by a procedure including deposition, lithography, patterning, and etching processes. The deposition processes may include CVD, ALD, PVD, other suitable methods, and/or combinations thereof.

Gate spacers are formed on the sidewalls of the dummy gate structures 240 and the top layer of the semiconductor layers 120. Gate spacers may include a single layer or a multi-layer structure. For example, in the depicted embodiment, a gate spacer layer 200 is formed over the top surface of the device, and a gate spacer layer 202 is formed over the gate spacer layer 200. The gate spacer layers 200 and 202 may each include silicon nitride ($Si_3N_4$), silicon oxide ($SiO_2$), silicon carbide (SiC), silicon oxycarbide (SiOC), silicon oxynitride (SiON), silicon oxycarbon nitride (SiOCN), carbon doped oxide, nitrogen doped oxide, porous oxide, or combinations thereof. In some embodiments, the gate spacer layers 200 and 202 may collectively has a thickness in the range of a few nanometers (nm). In some embodiments, the gate spacer layers 200 and/or 202 may be formed by depositing a spacer layer (containing the dielectric material) over the dummy gate structures 240, followed by an anisotropic etching process to remove portions of the spacer layer from the top surfaces of the dummy gate structures 240. After the etching process, portions of the spacer layer on the sidewall surfaces of the dummy gate structures 240 substantially remain and become the gate spacer layers 200 and/or 202. In some embodiments, the anisotropic etching process is a dry (e.g. plasma) etching process. Additionally or alternatively, the formation of the gate spacer layers 200 and/or 202 may also involve chemical oxidation, thermal oxidation, ALD, CVD, and/or other suitable methods.

Processing continues to selectively process the region configured for the PMOS transistor 100A, while leaving the region configured for the NMOS transistor 100B unaffected. For example, a mask layer 350 is formed to cover the region configured for the NMOS transistor 100B while leaving the region configured for the PMOS transistor 100A open. Accordingly, subsequent processing affects only the region configured for the PMOS transistor 100A. Referring to block 20 of FIG. 2A and FIG. 5, portions of the fin structure 108A adjacent to and exposed by the dummy gate structures 240 (e.g. in the source/drain regions 102) are at least partially recessed (or etched away) by process 500A to form the source/drain trenches 204A. Meanwhile, the portions of the fin structure 108A underneath the dummy gate structures 240 remain intact. Additional mask elements (not shown) may also be employed to protect areas not designed to be removed during the process 500A. In the depicted embodiment, the process 500A removes not only the exposed portions of fin structure 108A, but also a portion of the underlying substrate 105. Accordingly, the source/drain trenches 204A extends below the top surface of the substrate 105. In some embodiments (not shown), the process 500A removes only the exposed portions of the fin structure 108A, such that the top surface of the substrate 105 is exposed in the source/drain trenches 204A. Accordingly, the source/drain trenches 204A extends to a depth along the top surface of the substrate 105. In some other embodiments (not shown), the process 500A removes only some, but not all, of the fin structure 108A adjacent the dummy gate structures 240, such that the substrate 105 is not exposed in the source/drain trenches 204A. Accordingly, the source/drain trenches 204A extends to a depth above the top surface of the substrate 105. The process 500A may include multiple lithography and etching steps, and may use any suitable methods, such as dry etching and/or wet etching.

The formation of the source/drain trenches 204A exposes sidewalls of the stack of semiconductor layers 110 and 120 in the region configured for the PMOS transistor 100A. Referring to block 22 of FIG. 2B and FIG. 6, portions of the semiconductor layers 110 are removed through the exposed sidewall surfaces in the source/drain trenches 204A via a selective etching process, such as process 520A. The process 520A is designed to remove portions of the semiconductor layers 110 but only minimally affect the semiconductor layers 120. For example, two side portions of the semiconductor layers 110 may be removed to form openings 205 while the side portions of the semiconductor layers 120 directly above and below the openings 205 are substantially preserved. In some embodiments, those side portions of the semiconductor layers 120 may have their thicknesses reduced by about 1% to about 10% during the process 520A. The selective etching process may be any suitable processes. In an embodiment, the semiconductor layers 120 include Si and the semiconductor layers 110 include SiGe. The process 520A may be a wet etching process, such as a Standard Clean 1 (SC-1) solution. The SC-1 solution includes ammonia hydroxide ($NH_4OH$), hydrogen peroxide ($H_2O_2$), and water ($H_2O$). The SiGe semiconductor layers 110 may be etched away in the SC-1 solution at a substantially faster rate than the Si semiconductor layers 120. The etching duration is adjusted such that the size of the removed portions of SiGe layers is controlled. As a result, desired portions of the semiconductor layers 110 are removed while the semiconductor layers 120 are only minimally affected. The optimal condition may be reached by additionally adjusting the etching temperature, dopant concentration, as well as other experimental parameters.

In another embodiment, the semiconductor layers 120 include SiGe and the semiconductor layers 110 includes Si. A cryogenic deep reactive ion etching (DRIE) process may be used to selectively etch away the Si semiconductor layer 110. For example, the DRIE process may implement a sulfur hexafluoride-oxygen ($SF_6$—$O_2$) plasma. The optimal condition may be reached by adjusting the etching temperature, the power of the Inductively Coupled Plasma (ICP) power source and/or Radio Frequency (RF) power source, the ratio between the $SF_6$ concentration and the $O_2$ concentration, the dopant (such as boron) concentrations, as well as other experimental parameters. For example, the etching rate of a Si semiconductor layer 110 using a $SF_6$—$O_2$ plasma (with approximately 6% $O_2$) may exceed about 8 µm/min at a temperature of about −80° C.; while the SiGe semiconductor layers 120 are not substantially affected during the process.

Figure 6:
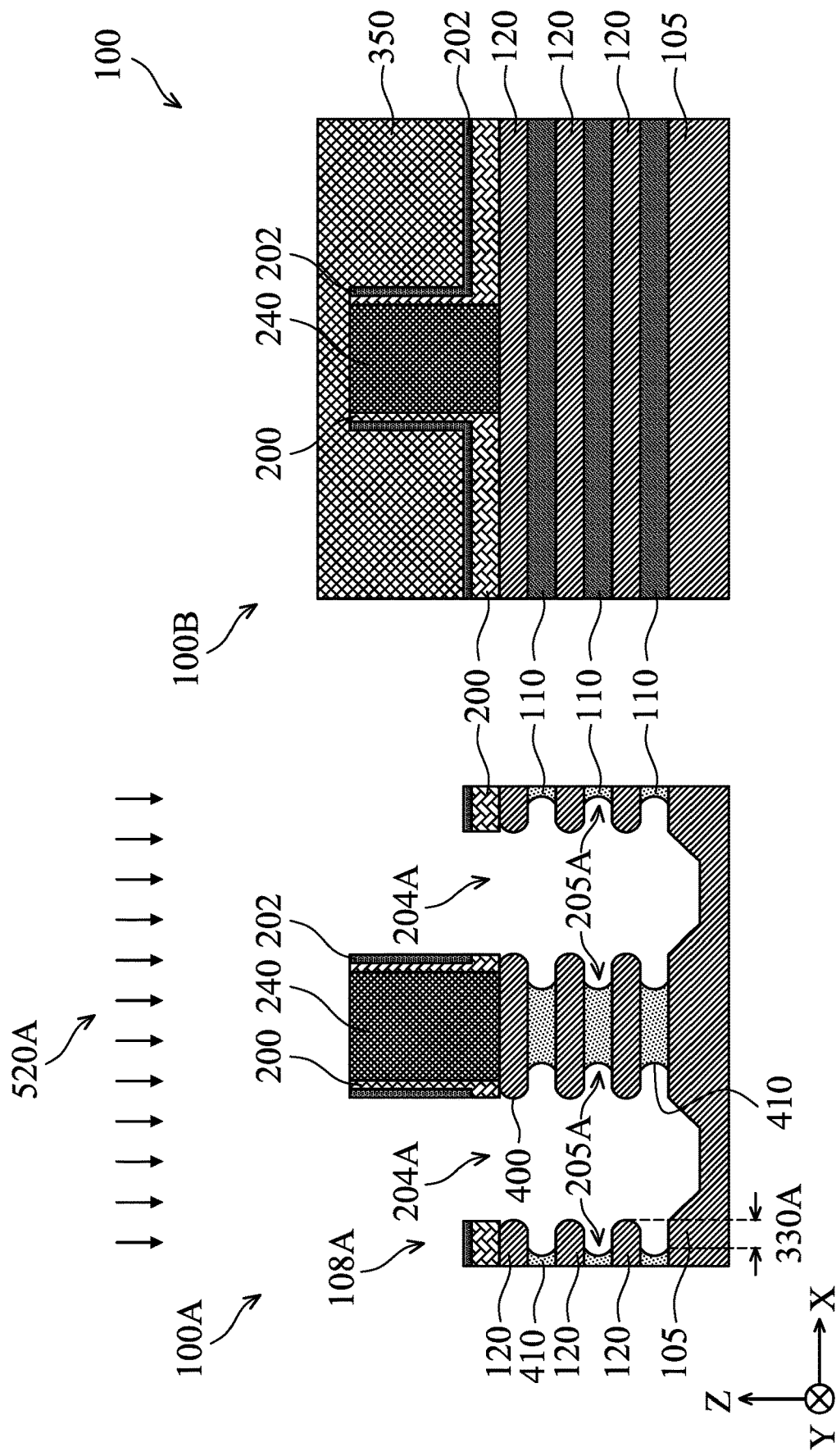

The openings 205A formed during the process 520A extend the source/drain trenches 204A into areas beneath the semiconductor layers 120 and gate spacer layers 200 and/or 202. As described above, the extent to which the semiconductor layers 110 are laterally recessed (or the size of the portion removed) is determined by the processing conditions such as the duration that the semiconductor layers 110 is exposed to an etching chemical. In the depicted embodiments, the duration is controlled such that the opening 205A has a depth 330A along the X-direction. In some embodiments, the etching process conditions cause the openings 205A to have curved surfaces. For example, as illustrated in FIG. 6, the openings 205A may have a curved interface (surface 410) with the remaining portions of the semiconductor layers 110. The surface 410 protrudes from the openings 205A into the semiconductor layers 110. Accordingly, the openings 205A may have a larger depth at its mid-height along the Z-direction than at its top or bottom interfaces with the semiconductor layers 120. In such embodiments, the depth 330A represents the average depth of the opening 205A. The depth 330A determines the upper limit of the lateral widths of inner spacers to be formed within the openings 205A. In some embodiments, the depth 330A may be about 5.5 nm to about 11 nm.

Additionally, the sidewalls of the semiconductor layers 120 may also have curved surfaces. As described above, although the semiconductor layers 120 are largely preserved during the process 520 due to their etching resistance to the etching chemical, they nevertheless may have their thicknesses slightly reduced. In addition, their sidewalls may be altered. For example, prior to the process 520A, the semiconductor layers 120 may have substantially straight side surfaces (see FIG. 5). But after the process 520A, the semiconductor layers 120 may have rounded (or curved) surfaces. The surface profiles of the semiconductor layers 120 carry significances in affecting the quality of epitaxial source/drain features subsequently formed in the openings 205A. This is described in more detail later. In the depicted embodiment, the semiconductor layers 120 each have a rounded surface 400 protruding into the source/drain trenches 204A. In other words, the semiconductor layers 120 may have a larger length along the X-direction at its mid-height along the Z-direction than at its top or bottom interfaces with the semiconductor layers 110 (and the openings 205). In some embodiments, the maximum length of the semiconductor layers 120 at their respective mid-height is about 20 nm to about 300 nm.

Figure 7:
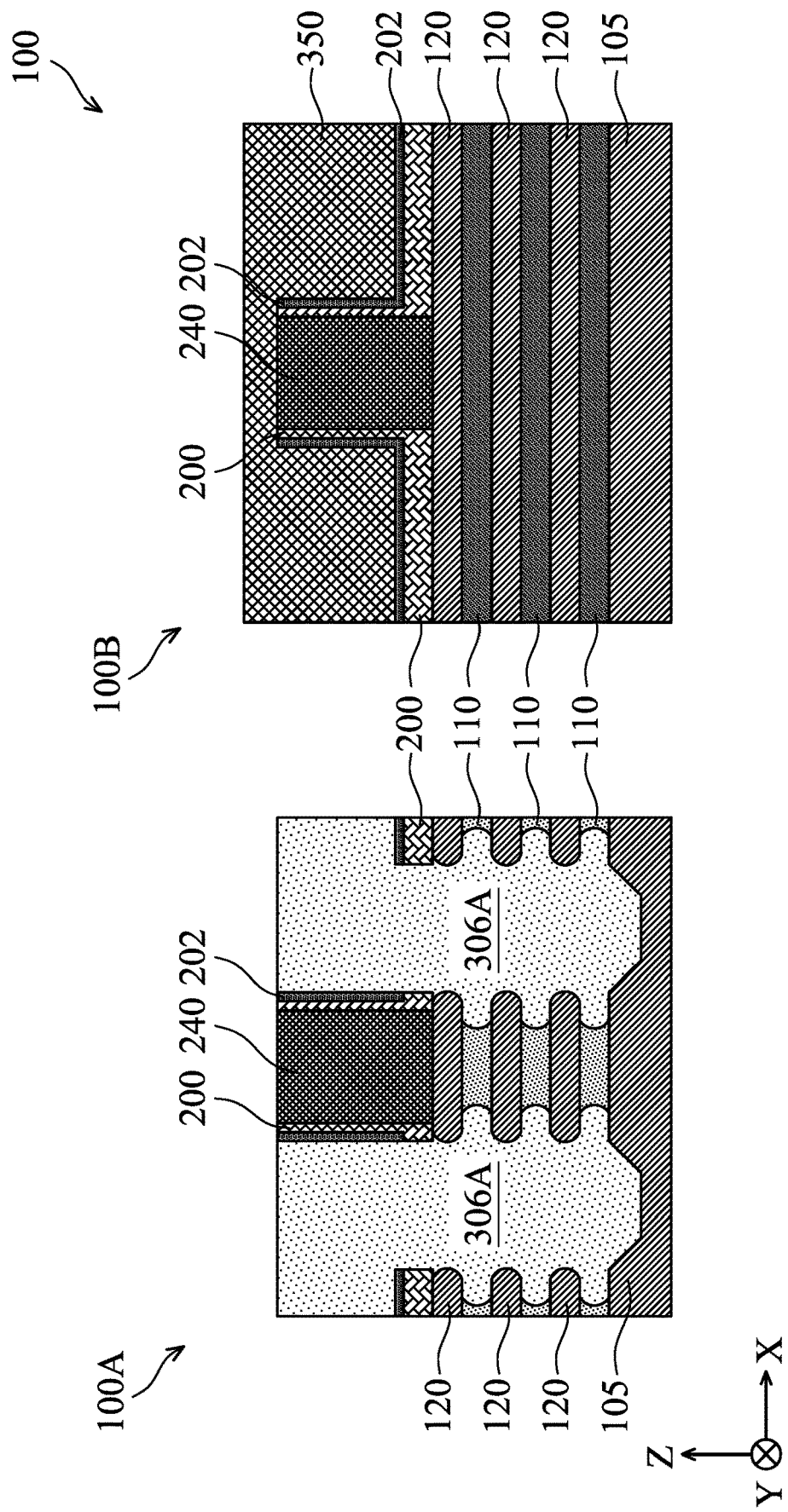

Referring to block 24 of FIG. 2B and FIG. 7, a dielectric material 306A is deposited into both the source/drain trenches 204A and the openings 205A. The dielectric material 306A may be selected from $SiO_2$, SiON, SiOC, SiOCN, or combinations thereof. In some embodiments, the proper selection of the dielectric material may be based on its dielectric constant (as described later). The deposition of the dielectric material 306A may be any suitable methods, such as CVD, PVD, PECVD, MOCVD, ALD, PEALD, or combinations thereof. In the depicted embodiment, the dielectric material 306A may have a top surface that extends along a top surface of the dummy gate structure 240. In other embodiments, the dielectric material 306A may have a top surface that extends above the top surface of the dummy gate structure 240, and a CMP process may be performed to planarize the top surfaces of the device, and to expose the top surfaces of the dummy gate structure 240.

Figure 8:
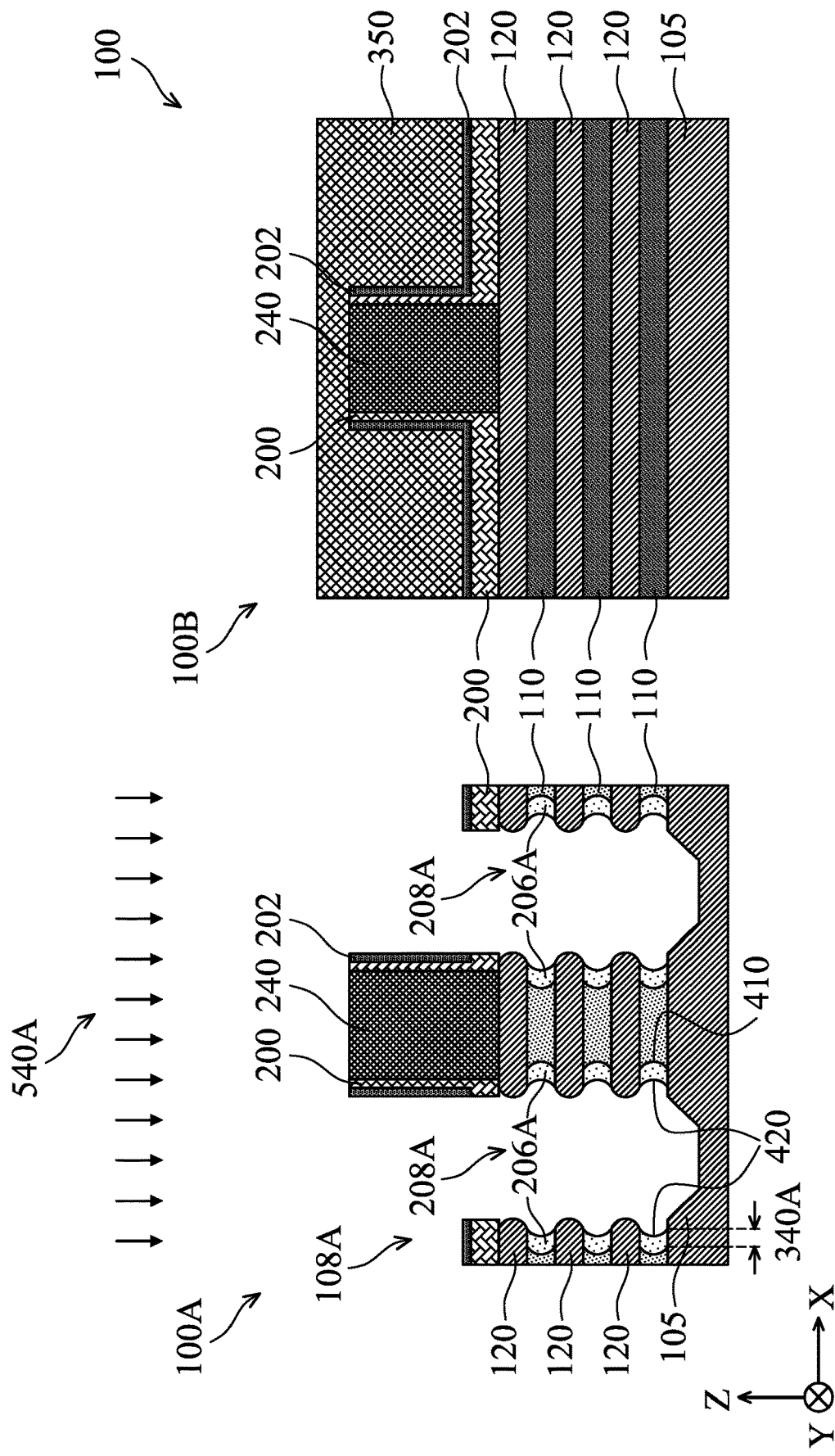

Referring to FIG. 8, the dielectric material 306A is partially etched back by process 540A to form new source/drain trenches 208A. The partial etching-back completely removes the dielectric materials 306A within the original source/drain trenches 204A, and removes a portion, but not all, of the dielectric materials 306A within the original openings 205A (compare FIG. 6). The dielectric materials 306A remaining in the openings 205A become the inner spacers 206A. Accordingly, the inner spacers 206A are formed between vertically adjacent semiconductor layers 120. In an embodiment, the etching-back is a self-aligned anisotropic dry-etching process, such that the gate spacer layers 200 and/or 202 are used as the masking element. Alternatively, a different masking element (e.g. a photoresist) may be used.

The inner spacers 206A interface the remaining portions of the semiconductor layers 110 at the surface 410. Additionally, the inner spacers 206A have a new surface 420 exposed in the source/drain trenches 208A. The distance between the surfaces 410 and 420 defines the lateral width 340A of the inner spacers 206A. The new surface 420 may be of a same or different profile as that of the surface 410. When the surfaces 410 and 420 have different profiles, the inner spacers 206A may have varying lateral widths at different heights of the inner spacers 206A along the Z-direction. In such embodiments, the lateral width 340A represents an average lateral width of the inner spacers 206A. The lateral width 340A is smaller than the depth 330A of the opening 205A. The lateral width 340A is important to tuning the capacitance parameters; and the surface profiles are important to improving the quality of the epitaxial source/drain features subsequently formed. These aspects of the disclosure will be described in detail later.

Figure 9:
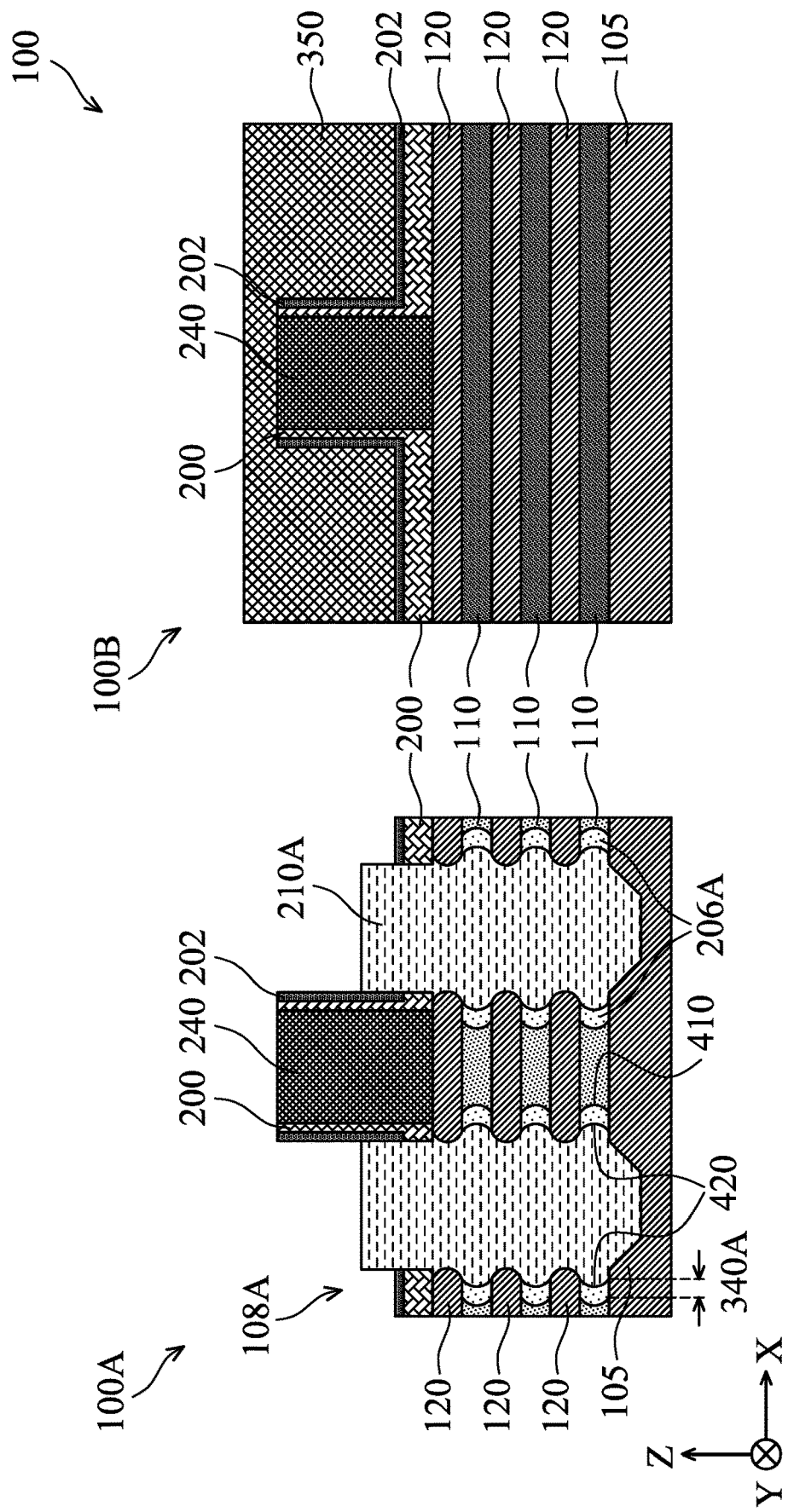
Figure 10:
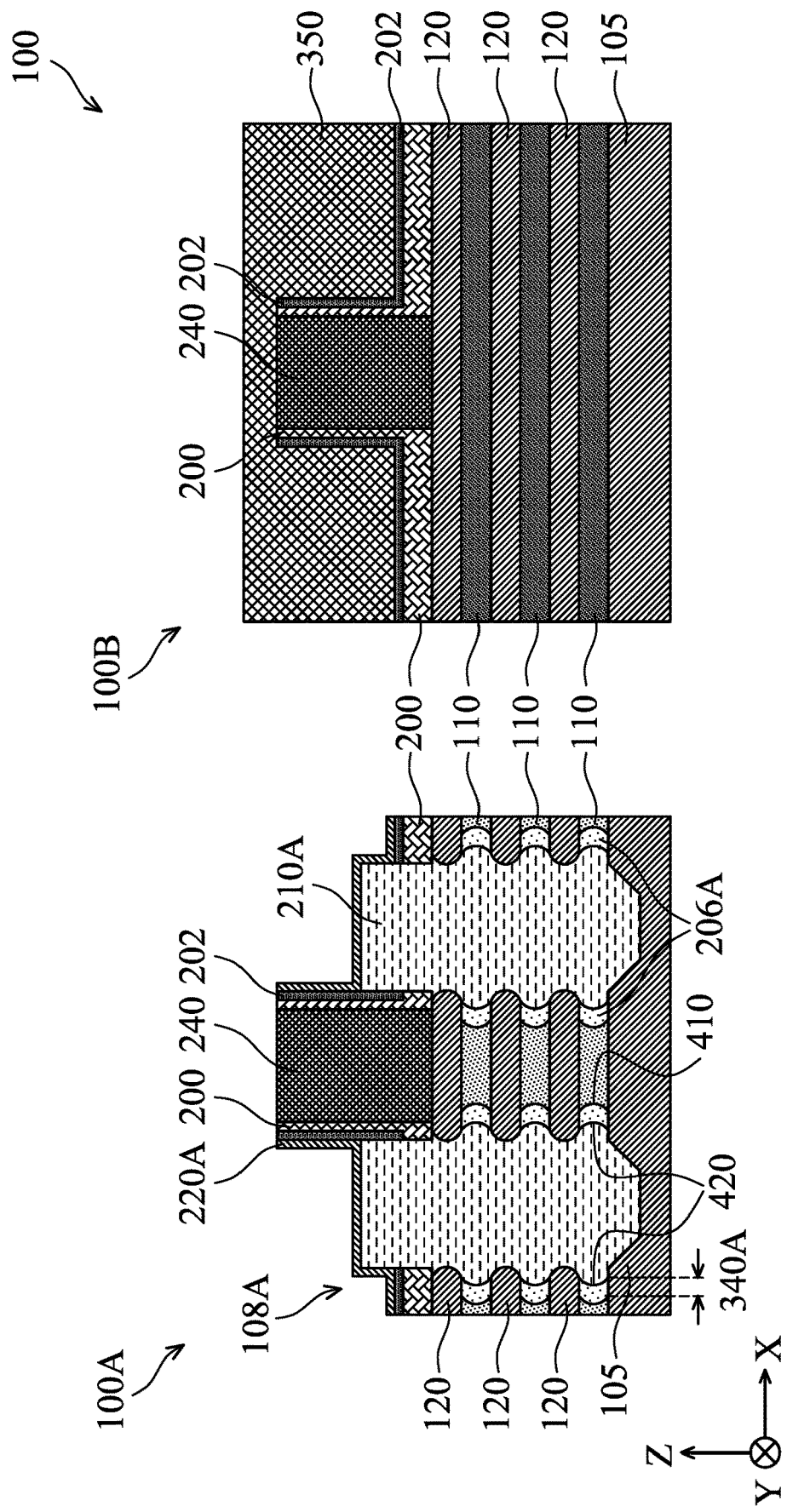

Referring to block 26 of FIG. 2B and FIG. 9, epitaxial source/drain features 210A are formed in the source/drain trenches 208A. Accordingly, the epitaxial source/drain features 210A interface with the inner spacers 206A at the surface 420. Multiple processes, including etching and growth processes, may be employed to grow the epitaxial source/drain features 210A. In the depicted embodiment, the epitaxial source/drain features 210A have top surfaces that extend higher than the top surface of the topmost semiconductor layer 120. However, in other embodiments, the epitaxial source/drain features 210A may alternatively have top surfaces that are about even with the top surface of the topmost semiconductor layer 120. In some embodiments, the epitaxial source/drain features 210A may merge together, for example, along the Y-direction (see e.g., FIG. 1A), to provide a larger lateral width than an individual epitaxial source/drain feature.

In the depicted embodiment, the epitaxial source/drain features 210A are configured to be part of the PMOS transistor 100A. Accordingly, the epitaxial source/drain features 210A may include any suitable p-type semiconductor materials, such as Si, SiGe, Ge, SiGeC, or combinations thereof. The epitaxial source/drain features 210A may be doped in-situ or ex-situ. For example, the epitaxially grown SiGe source/drain features may be doped with boron. One or more annealing processes may be performed to activate the dopants in the epitaxial source/drain features 210A. The annealing processes may comprise rapid thermal annealing (RTA) and/or laser annealing processes. As illustrated in FIG. 9, each pair of epitaxial source/drain features 210A are connected by multiple semiconductor layers 120, which serve as the carrier conduit between the epitaxial source/drain features 210A during the operation. Additionally, referring to FIG. 10, the embodiments of method 10 optionally include forming a contact etch stop layers 220A over the epitaxial source/drain features 210A, as well as gate spacer layers 200 and/or 202.

The processing steps described above form epitaxial source/drain features 210A and inner spacers 206A of the PMOS transistor 100A. Embodiments of method 10 continues to form components of the NMOS transistor 100B. For example, the mask layer 350 over the region configured for the NMOS transistor 100B is removed, and a new mask layer 360 is formed over the region configured for the PMOS transistor 100A. Accordingly, subsequent processing affects only the region configured for the NMOS transistor 100B.

The mask layer 360 may have a material the same as or different from that of the mask layer 350.

Figure 11:
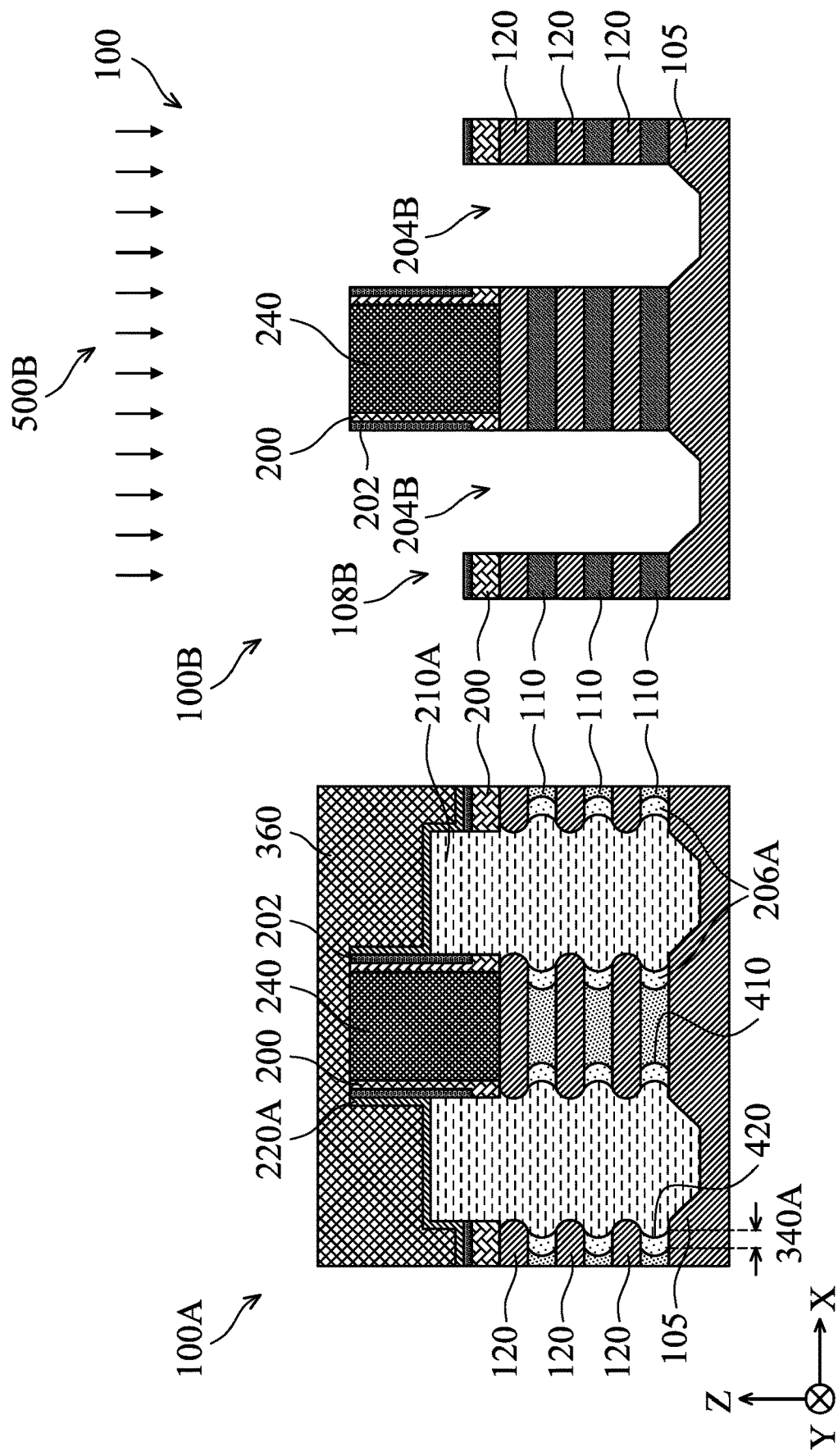

Referring to block 28 of FIG. 2B and FIG. 11, portions of the fin structure 108B adjacent to and exposed by the dummy gate structures 240 (e.g. in the source/drain regions 102) are at least partially recessed (or etched away) by process 500B to form the source/drain trenches 204B for subsequent epitaxial source and drain growths. The recess process 500B may be substantially similar to the process 500A described above with respect to FIG. 5. Accordingly, the source/drain trenches 204B may extend to a depth that is above, along or below the top surface of the substrate 105. The depth of the source/drain trenches 204B may be the same as, greater than, or less than the depth of the source/drain trenches 204A. For example, the source/drain trenches may have different depths in order to accommodate for the different growth requirements in subsequent epitaxial deposition processes in different regions, and/or to effectuate different strains in the later-formed source/drain features based on design requirements. Meanwhile, the portions of the fin structure 108B underneath the dummy gate structures 240 remain intact. Additionally, the process 500B exposes the sidewalls of the stack of semiconductor layers 110 and 120. Referring to block 30 of FIG. 2B and FIG. 12, portions of the semiconductor layers 110 are removed through the exposed sidewall surfaces in the source/drain trenches 204B via a selective etching process, such as process 520B, thereby forming openings 205B between adjacent layers of the semiconductor layers 120.

Figure 12:
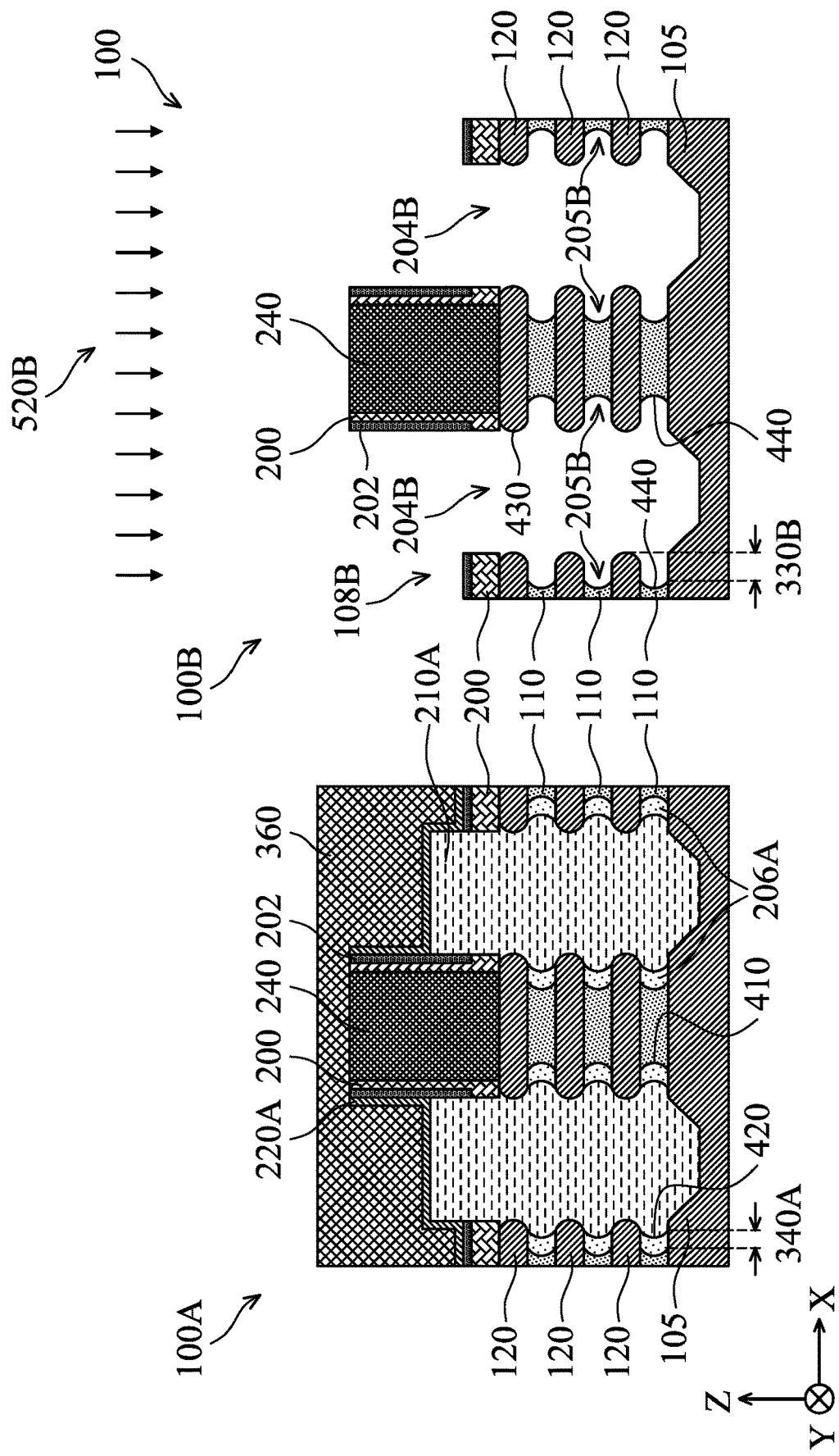

In the depicted embodiments, the process 520B removes a portion of semiconductor layers 110 that has a lateral width (or average lateral width) 330B. In some embodiments, the openings 205B may have curved surfaces. For example, as illustrated in FIG. 12, the openings 205B may have a curved interface (surface 440) with the remaining portions of the semiconductor layers 110. The surface 440 protrudes from the openings 205B into the semiconductor layers 110. Accordingly, the openings 205B may have a larger depth at its mid-height along the Z-direction than at its top or bottom interfaces with the semiconductor layers 120. In such embodiments, the depth 330B represents the average depth of the opening 205B. Additionally, as described above with respect to PMOS transistor 100A, the side surfaces of the semiconductor layers 120 may be slightly etched during the process 520B removing the semiconductor layers 110. As a result, the semiconductor layers 120 may now have rounded (or curved surfaces). For example, as illustrated in FIG. 12, the semiconductor layers each have a rounded surface 430 protruding into the source/drain trenches 204B. Additionally, the portions of the semiconductor layers 120 directly above and below the openings 205B may further has reduced thicknesses, as compared to before the process 520B is performed. For example, these portions may have thicknesses that are about 1% to about 10% less than before the process 520B is performed.

The process 520B may be any suitable processes. In an embodiment, the processes 520A and 520B are the same method. For example, both the processes 520A and 520B are SC-1 etching process. Alternatively, both the processes 520A and 520B are cryogenic DRIE processes. In another embodiment, the processes 520A and 520B are different methods. For example, process 520A may employ an SC-1 wet etching to form the openings 205A while process 520B may employ a cryogenic DRIE process to form the openings 205B. In some embodiments, different etching methods result in different surface profiles, such that the profile of the surface 420 (of the openings 205A) and the profile of the surface 440 (of the openings 205B) are different from each other. The significances of the depths and the profiles of the surface 440 will be described in detail later.

At this stage, embodiments 10A and 10B of the method 10 diverge, and the processing may proceed along either of the two pathways. FIG. 2B and FIGS. 13-21 illustrate subsequent steps of embodiment 10A of method 10, while FIG. 2C and FIGS. 23-29 illustrate subsequent steps of embodiment 10B of method 10.

Figure 13:
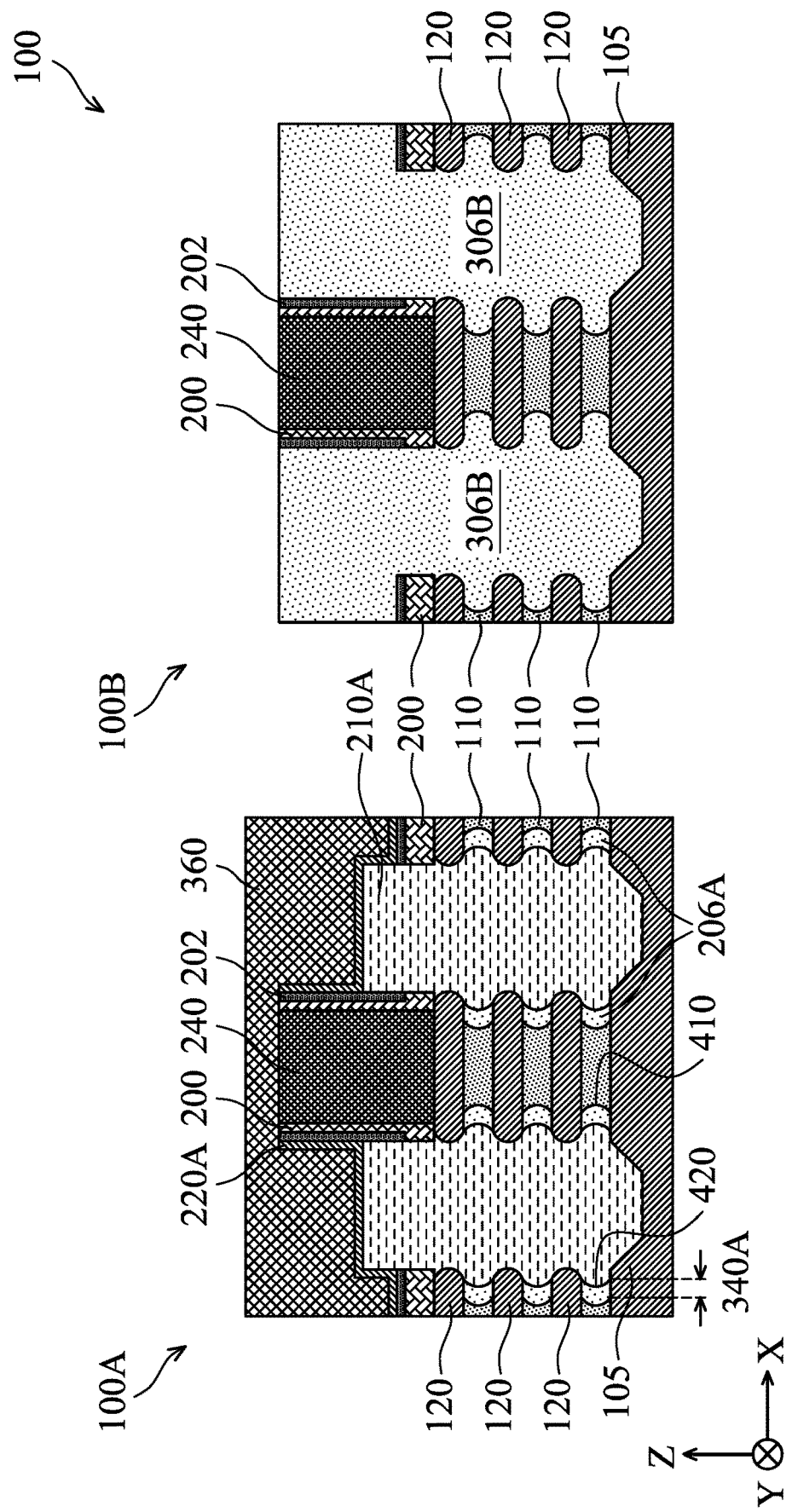

Referring to block 32A of FIG. 2C and FIG. 13, a dielectric material 306B is deposited into both the source/drain trenches 204B and the openings 205B. The dielectric material 306B may be selected from SiO$_2$, SiON, SiOC, SiOCN, or combinations thereof. The dielectric material 306B may be deposited by any suitable methods, such as those described above with respect to the dielectric material 306A. The dielectric material 306B may be the same material as, or a different material from, the dielectric material 306A, depending on the design needs. In some embodiments, the proper selection of the dielectric material may be based on the dielectric constants. In an embodiment, this dielectric material 306B may have a dielectric constant lower than that of the dielectric material 306A. In some other embodiments, this dielectric material 306B may have a dielectric constant higher than that of the dielectric material 306A. This aspect of the dielectric material 306A will be further discussed later.

Figure 14:
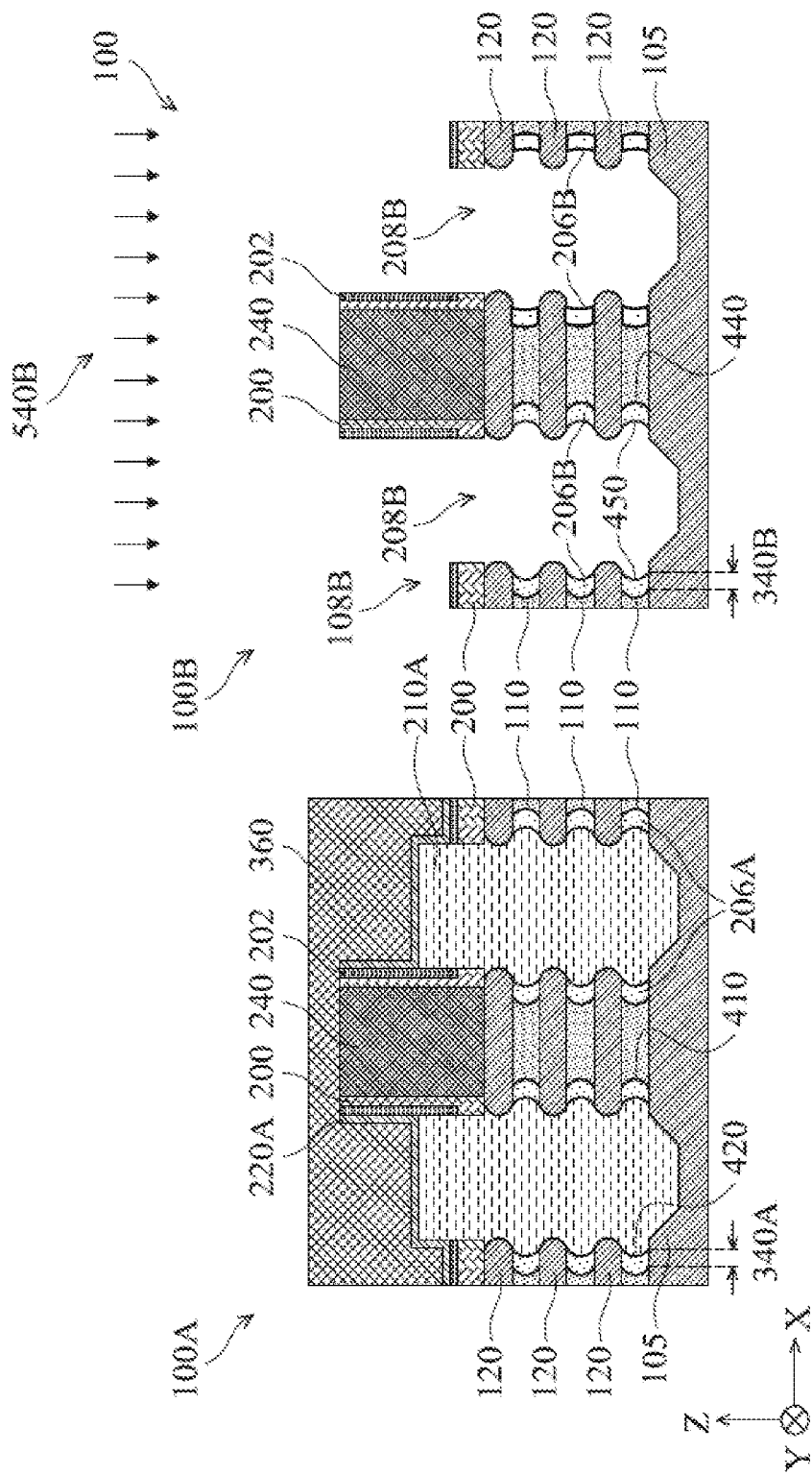

Referring to block 34A of FIG. 2C and FIG. 14, the dielectric material 306B is etched back in process 540B to form inner spacers 206B. The formation of the inner spacers 206B share many similar aspects as the formation of inner spacers 206A (see description above with respect to FIG. 8). For example, the process 540B also forms new source/drain trenches 208B (similar to the source/drain trenches 208A described above); the inner spacers 206B have a lateral width 340B (similar to the lateral width 340A of the inner spacers 206A); the inner spacers 206B interface with the semiconductor layers 110 at the surface 440 (similar to the surface 410 of the inner spacers 206A) and interface with the source/drain trenches 208B at the surface 450 (similar to the surface 420 of the inner spacers 206A). The process 540B may use the same etching method as, or a different etching method from, that of the process 540A. In the depicted embodiment, the process 540B employs a different etching method as that of the process 540A. For example, the process 540A may use a wet-etching method, while the process 540B may use a dry-etching method; or the process 540A may use a SC-1 wet etching method, while the process 540B may use a standard clean-2 (SC-2) wet etching method. As described above, different etching methods may produce different surface profiles. For example, the surface 450 may have a different profile from that of the surface 420. In the depicted embodiment, the surface 450 has a smaller curvature than the surface 420. Additionally, the lateral width 340B may also differ from the lateral width 340A of the inner spacers 206A. The significances of the lateral widths and surface profiles are described in more details later.

Figure 15:
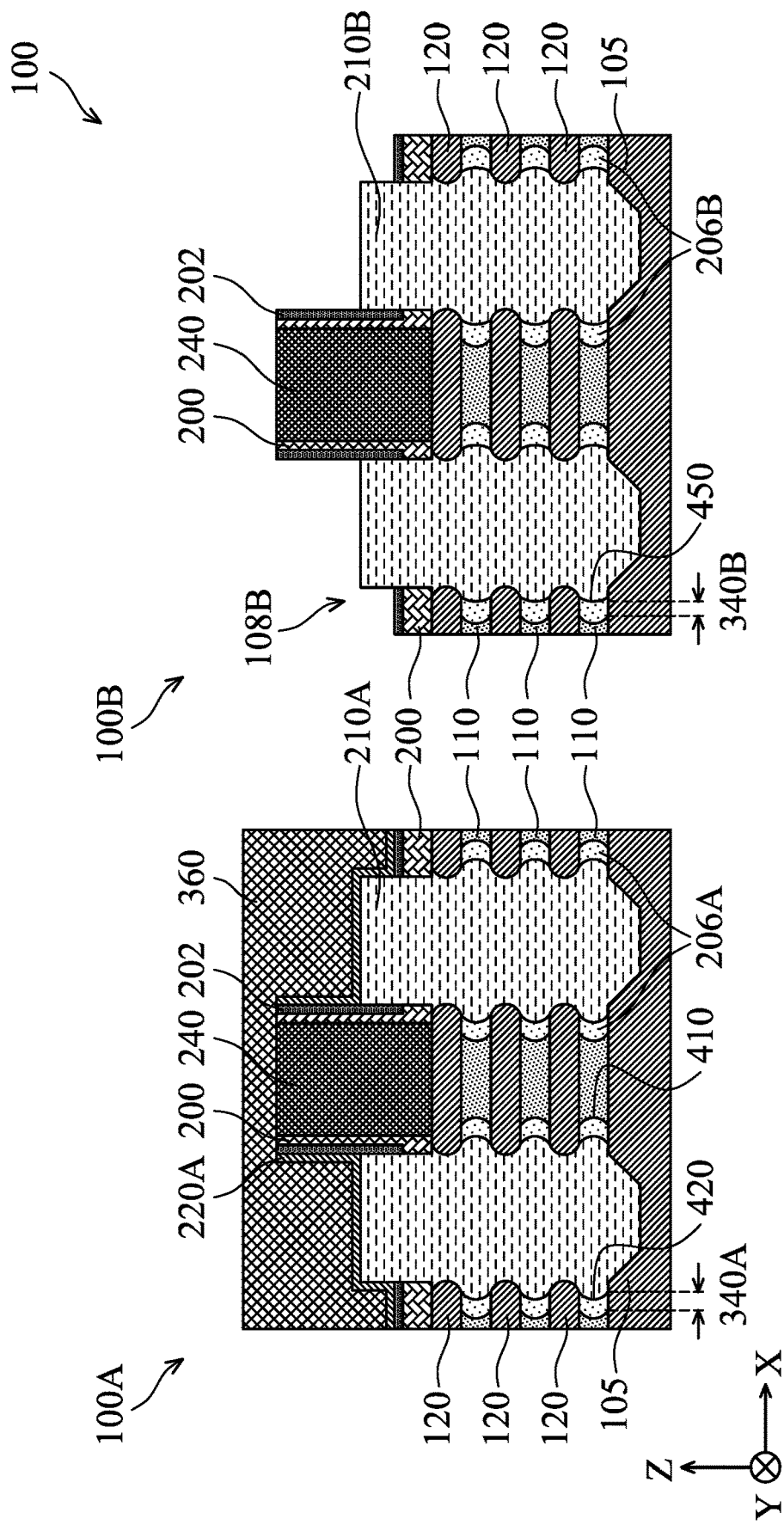
Figure 16:
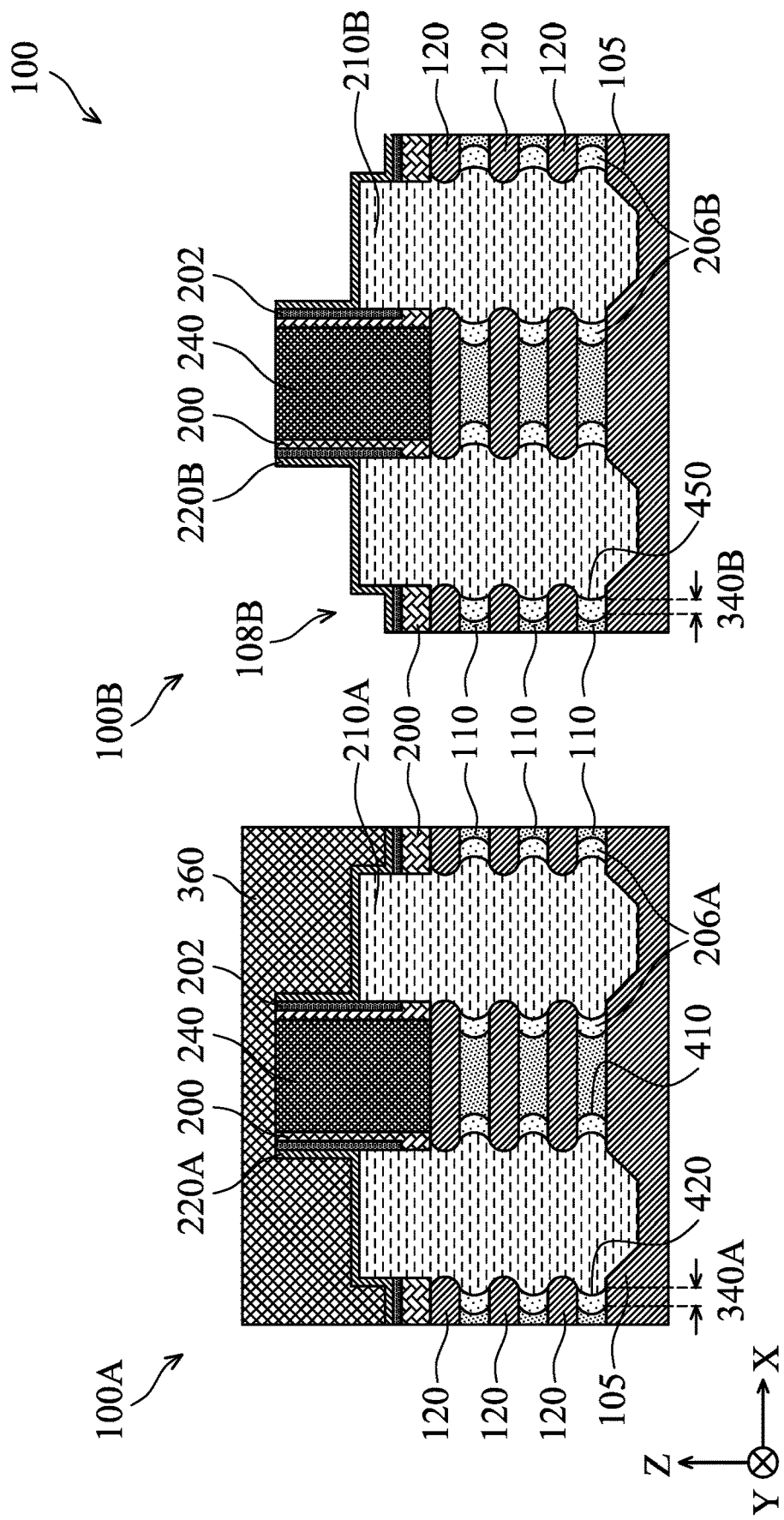

Referring to block 34A of FIG. 2C and FIG. 15, embodiment 10A of the method 10 continues to form epitaxial source/drain features 210B in the source/drain trenches 208B. Accordingly, the epitaxial source/drain features 210B interface with the inner spacers 206B at the surface 450. The epitaxial source/drain features 210B generally resemble the epitaxial source/drain features 210A, and may be formed by similar methods. However, the epitaxial source/drain features may include different dopants. In the depicted embodiment, the epitaxial source/drain features 210B are configured for an NMOS transistor 100B. Accordingly, the epitaxial source/drain features 210 are doped with n-type dopants in-situ or ex-situ with the epitaxial growth. For example, the epitaxially grown Si source/drain features may be doped with carbon to form silicon:carbon (Si:C) source/drain features, phosphorous to form silicon:phosphor (Si:P) source/drain features, or both carbon and phosphorous to form silicon carbon phosphor (SiCP) source/drain features. Referring to FIG. 16, an optional contact-etch stop layer 220B may be formed over the epitaxial source/drain features 210B.

Figure 17:
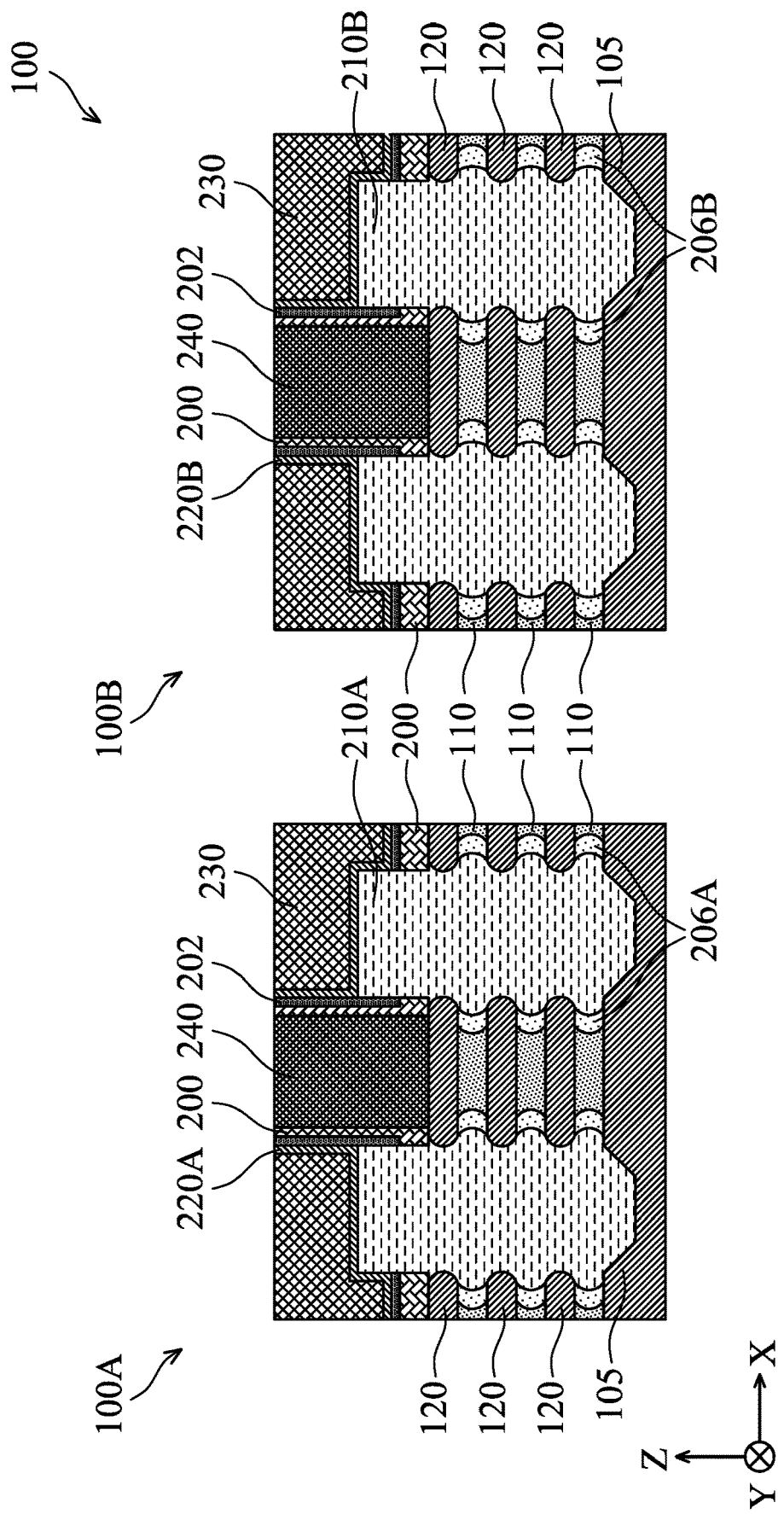

Referring to FIG. 17, the mask layer 360 is removed from the region configured for the PMOS transistor 100A, and an interlayer dielectric (ILD) layer 230 is formed over the epitaxial source/drain features 210A and 210B, as well as vertically over the isolation features 150. The ILD layer 230 may also be formed in between the adjacent dummy gate structures 240 along the X-direction, and in between the adjacent source/drain features 210A/210B along the Y-direction. The ILD layer 230 may include a dielectric material, such as a high-k material, a low-k material, or an extreme low-k material. For example, the ILD layer 230 may include SiO$_2$, SiOC, SiON, or combinations thereof. The materials of the ILD layer 230 may be the same as or different from that of the mask layers 350 and/or 360. The ILD layer 230 may include a single layer or multiple layers, and may be formed by a suitable technique, such as CVD, ALD, and/or spin-on techniques. After forming the ILD layer 230, a CMP process may be performed to remove excessive ILD layer 230 and planarized the top surface of the ILD layer 230. Among other functions, the ILD layer 230 provides electrical isolation between the various components of the PMOS transistors 100A and NMOS transistor 100B.

Figure 18:
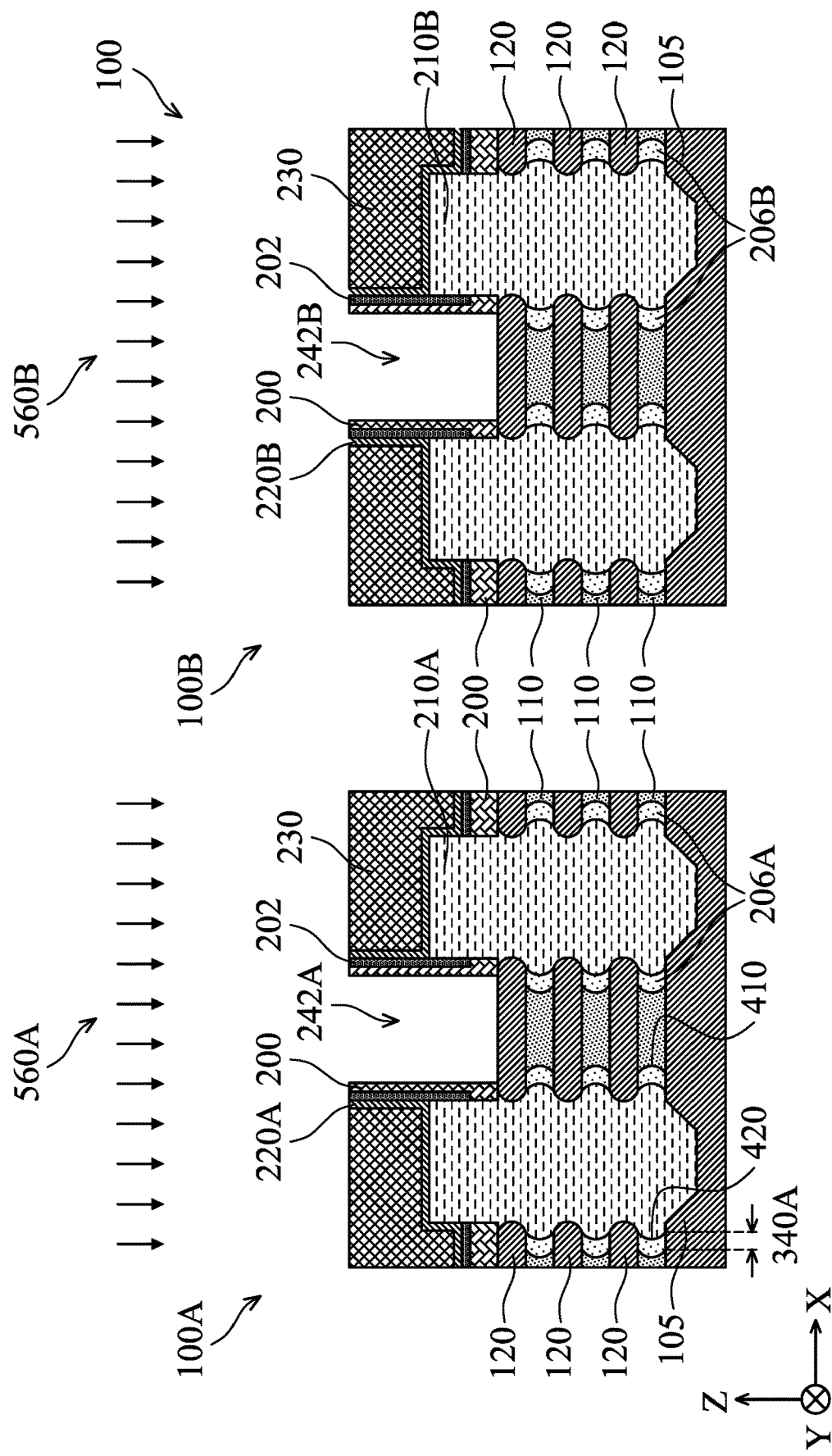

Referring to block 36A of FIG. 2C and FIG. 18, the dummy gate structures 240 in the region configured for the PMOS transistor 100A are selectively removed in process 560A, and the dummy gate structures 240 in the region configured for the NMOS transistor 100B are selectively removed in process 560B. The removal of the dummy gate structures 240 creates gate trenches 242A and 242B, respectively, which expose the respective top surfaces and the side surfaces of the semiconductor stacks (along the Y direction). The processes 560A and 560B each may be selected from any suitable lithography and etching processes. In some embodiments, the lithography process may include forming a photoresist layer (resist), exposing the resist to a pattern, performing a post-exposure bake process, and developing the resist to form a masking element, which exposes a region including the dummy gate structures 240. Then, the dummy gate structures 240 are selectively etched through the masking element. In some other embodiments, the gate spacer layers 200 and/or 202 may be used as the masking element or a part thereof. The processes 560A and 560B may be the same or different processes, and may be performed at the same or different times. Accordingly, the gate trenches 242A and 242B may be formed at the same or different times.

Figure 19:
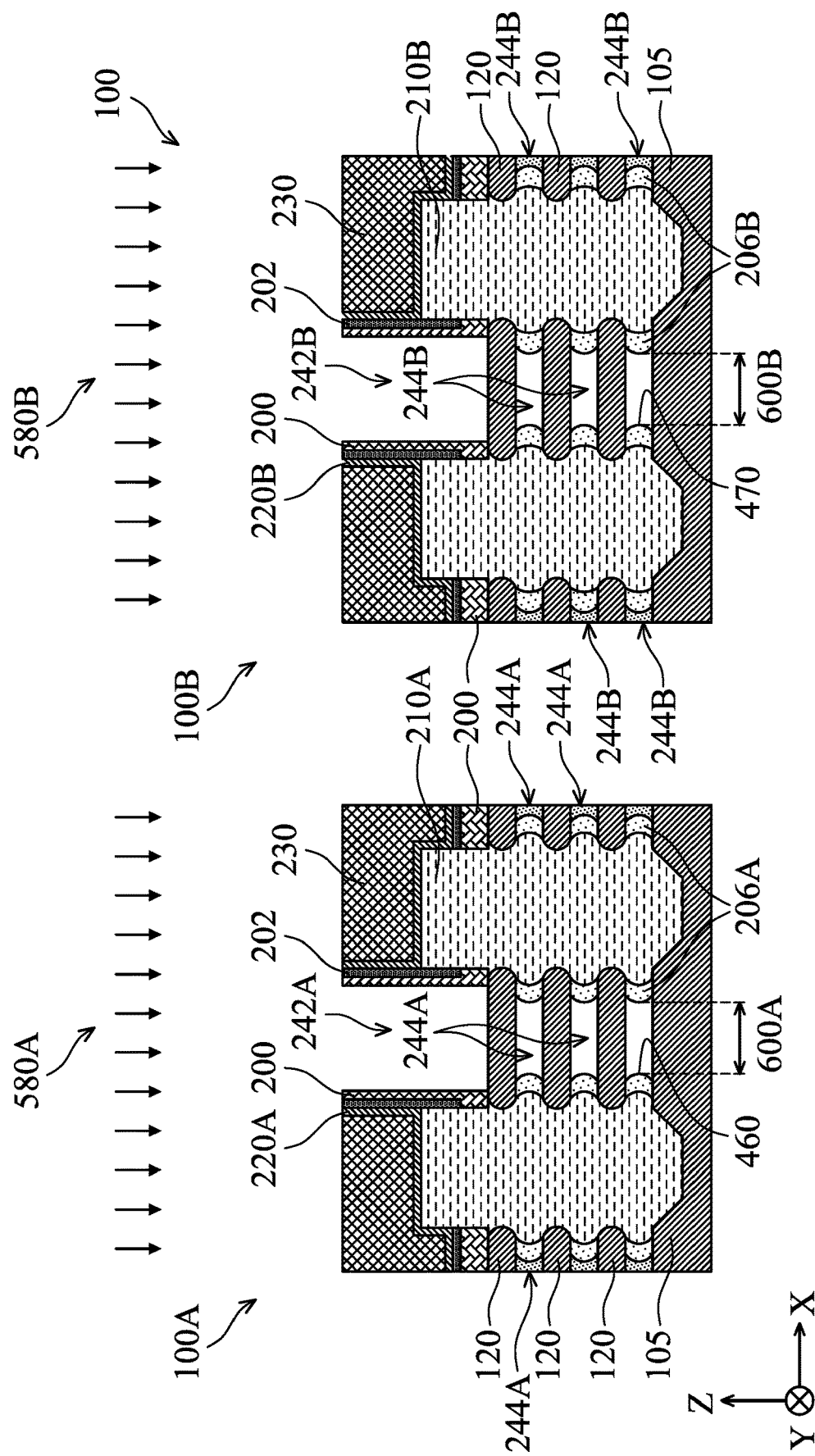

Referring to blocks 38A and 40A of FIG. 2C and FIG. 19, the remaining portions of the semiconductor layers 110 are selectively removed through the exposed side surfaces of the semiconductor layers 120. For example, the semiconductor layers 110 in the region configured for the PMOS transistor 100A is removed in process 580A; and the semiconductor layers 110 in the region configured for the NMOS transistor 100B is removed in process 580B. Similar to processes 520A and 520B, the semiconductor layers 120 may be slightly affected during the processes 580A and 580B. For example, the thickness of the semiconductor layers 120 may be reduced by about 1% to about 10%. The removal of the remaining portions of the semiconductor layers 110 form suspended semiconductor layers 120, as well as openings 244A and 244B, respectively, in between the vertically adjacent layers. Accordingly, the center portions of the semiconductor layers 120 each have exposed top and bottom surfaces. In other words, the center portions of each of the semiconductor layers 120 are now exposed circumferentially around the X-direction. The openings 244A may have a length 600A; and the openings 244B may have a length 600B. In the depicted embodiments, the surfaces of the openings 244A and 244B are curved. Accordingly, the openings 244A and 244B each have different lengths at different heights along the Z-direction. Therefore, the lengths 600A and 600B represent the average lengths of the openings 244A and 244B, respectively. The lengths 600A and 600B may be the same as, or different from, each other. This is described in more details below.

The processes 580A and 580B may be any suitable etching processes. Further, the processes 580A and 580B may be the same or different processes, and may be performed at the same or different time. In addition to exposing top and bottom surfaces of the center portions of the semiconductor layers 120, these processes also expose the sidewall surfaces of the inner spacers 206A and 206B respectively. The exposed sidewall surfaces may or may not have been modified by the processes 580A and 580B. For example, the process 580A exposes surface 460 of the inner spacer 206A. The surface 460 may be the same as, or different from, the surface 410, depending on the choices of the etching methods and/or the materials of the inner spacers 206A. Similarly, the process 580B exposes sidewall surface 470 of the inner spacer 206B; and the surface 470 may be the same as, or different from, the surface 440, depending on the choices of the etching methods and/or the materials of the inner spacers 206B.

Figure 20:
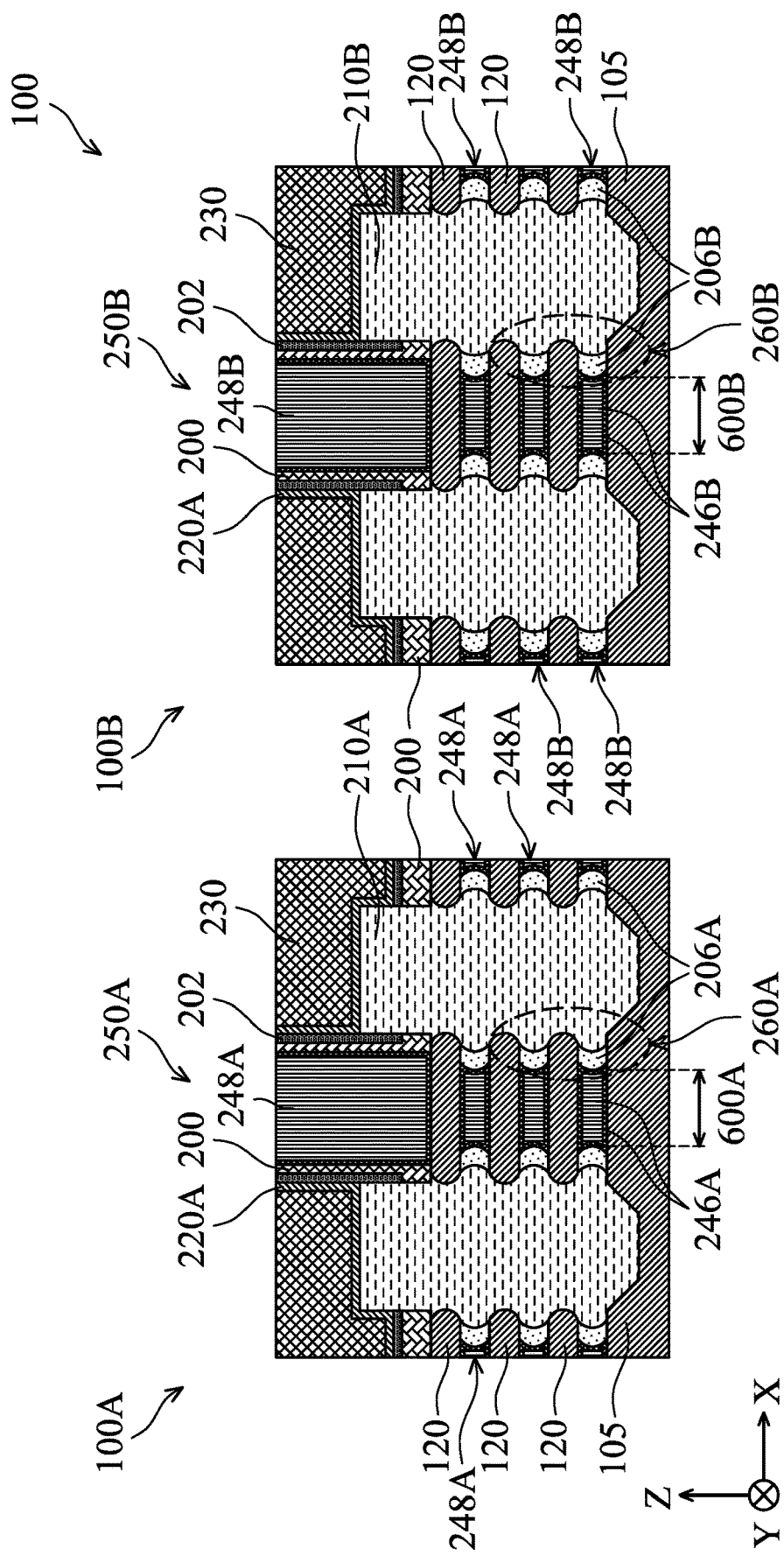

Referring to block 42A of FIG. 2C and FIG. 20, a gate structure 250A is formed in the openings 244A and the gate trenches 242A. For example, a gate dielectric layer 246A is formed over and between the semiconductor layers 120, and a conductive metal layer 248A is formed over and between the portions of the gate dielectric layers 246A. In some embodiments, the gate dielectric layer 246A includes multiple layers. For example, the gate dielectric layer 246A may include a high-k dielectric layer. The high-k gate dielectric layer may be formed conformally such that it at least partially fills the gate trenches 242A. In some embodiments, the high-k gate dielectric layer may be formed around the exposed surfaces of each of the semiconductor layers 120, such that it wraps around each of the semiconductor layers 120 in 360 degrees. The high-k gate dielectric layer may further be formed over the side surfaces of the inner spacers 206A, and the gate spacer layers 200. The high-k gate dielectric layer may contain a dielectric material having a dielectric constant greater than a dielectric constant of $SiO_2$, which is approximately 3.9. For example, the high-k gate dielectric layer may include hafnium oxide ($HfO_2$), which has a dielectric constant in a range from about 18 to about 40. As various other examples, the high-k gate dielectric layer may include $ZrO_2$, $Y_2O_3$, $La_2O_5$, $Gd_2O_5$, $TiO_2$, $Ta_2O_5$, HfErO, HfLaO, HfYO, HfGdO, HfAlO, HfZrO, HfTiO, HfTaO, SrTiO, or combinations thereof. The formation of the high-k gate dielectric layers may be by any suitable processes, such as CVD, PVD, ALD, or combinations thereof.

In some embodiments, the gate dielectric layer 246A further includes an interfacial layer. The interfacial layer is formed between the semiconductor layers 120 and the high-k dielectric layer. Any suitable methods may be used to form the interfacial layer, such as ALD, CVD, or other deposition methods. Alternatively, the interfacial layer may also be formed by an oxidation process, such as thermal oxidation or chemical oxidation. In this instance, no interfacial layer is formed on the sidewalls of the inner spacers 206A or the gate spacer layers 200. In many embodiments, the interfacial layer improves the adhesion between the semiconductor substrate and the subsequently formed high-k dielectric layer. However, in some embodiments, the interfacial layer is omitted.

The conductive metal layer 248A is formed over the gate dielectric layer 246A and fills the remaining spaces of the gate trenches 242A and the openings 244A. The conductive metal layer 248A may include a work function metal layer. In the depicted embodiment, the conductive metal layer 248A is configured for the PMOS transistor 100A. Accordingly, the work function metal layer may include any suitable p-type work function metal materials, such as titanium nitride (TiN), ruthenium (Ru), iridium (Ir), osmium (Os), rhodium (Rh), or combinations thereof. The conductive metal layer 248A may further include a fill metal layer. The fill metal layer may include any suitable materials, such as aluminum (Al), tungsten (W), copper (Cu), cobalt (Co), nickel (Ni), platinum (Pt), ruthenium (Ru), or combinations thereof. In some embodiments, a CMP is performed to expose a top surface of the ILD layer 230. The gate dielectric layer 246A and the conductive metal layer 248A collectively form the gate structure 250A. The gate structure 250A engages multiple semiconductor layers 120 to form multiple gate channels. The multiple gate channels each have a channel length (or an average channel length) that is the same as the length 600A of the openings 244A. Accordingly, the length 600A is also referred to as the channel length 600A.

Referring to block 44A of FIG. 2C and FIG. 20, a gate structure 250B is formed in the openings 244B and the gate trenches 242B. The gate structure 250B may have similar structures as gate structure 250A. For example, the gate structure 250B may include a gate dielectric layer 246B and a conductive metal layer 248B. The gate dielectric layer 246B may include a high-k dielectric layer (e.g., $HfO_2$) and an interfacial layer. The conductive metal layer 248B may include a work function metal layer and a fill metal layer. In the depicted embodiment, the conductive metal layer 248B is configured for the NMOS transistor 100B. Accordingly, the work function metal layer may include any suitable n-type work function metal materials, such as titanium (Ti), aluminum (Al), tantalum (Ta), titanium aluminum (TiAl), titanium aluminum nitride (TiAlN), tantalum carbide (TaC), tantalum carbide nitride (TaCN), tantalum silicon nitride (TaSiN), or combinations thereof. The fill metal layer may include any suitable materials such as Al, W, Cu, Co, Ni, Pt, Ru, or combinations thereof. The gate structure 250B engages multiple semiconductor layers 120 to form multiple gate channels. The multiple gate channels each have a channel length (or an average channel length) that is substantially the same as the length 600B of the openings 244B. Accordingly, the length 600B is also referred to as the channel length 600B. The length 600B may be the same as, or different from, the length 600A.

As describe above, the inner spacers 206A and the inner spacers 206B may have the same or different materials, the same or different lateral widths, and the same or different surface profiles; and the PMOS transistor 100A may have the same or different gate channel lengths as the NMOS transistor 100B. The materials and the lateral widths of the inner spacers may be tuned to achieve overall balanced capacitance of the nano-sheet-based CMOS; the gate channel lengths of may be tuned to achieve overall balanced current of the nano-sheet-based CMOS; and the surface profiles of the inner spacers may be tuned to optimize the qualities of the epitaxial source/drain features.

More specifically, a nano-sheet-based CMOS device includes various device regions that may be considered as capacitors. For example, the inner spacers 206A may be considered to be the dielectric medium of a capacitor between a pair of vertically aligned conductive plates, i.e., the sidewall of the epitaxial source/drain feature 210A and the sidewall of the gate structure 250A. This is denoted as region 260A in FIG. 20. Similarly, the inner spacers 206B may be considered to be the dielectric medium of another capacitor between another pair of vertically aligned conductive plates, i.e., the sidewall of the epitaxial source/drain feature 210B and the sidewall of the gate structure 250B. This is denoted as region 260B in FIG. 20. In some embodiments, the optimal performance of the nano-sheet-based CMOS device may be reached when the capacitances of the regions 260A and 260B are balanced. Balancing the capacitances require separately tuning parameters for each of the capacitors.

In a parallel plate capacitor, the capacitance is proportional to the dielectric constant of the dielectric medium, and is inversely proportional to the separation distance of plates, according to the following equation:

$$C = \varepsilon \frac{A}{d} = k\varepsilon_0 \frac{A}{d}$$

wherein C is the capacitance of the capacitor, E is the permittivity of the dielectric medium, $\varepsilon_0$ is the permittivity of vacuum, A is the area of the plates, d is the separation distance of the plates, and k is the dielectric constant of the dielectric medium. Therefore, a smaller dielectric constant leads to a smaller capacitance; and a smaller separation distance leads to larger capacitance. The method of the present disclosure provides the flexibility of forming inner spacers of different material compositions and/or lateral widths, such that the regions 260A and 260B may be individually optimized for the overall optimized performances of the nano-sheet-based CMOS.

In an embodiment, the inner spacers 206A has a lateral width 340A of about 5 nm to about 7 nm. If the lateral width is too small, such as less than 5 nm, the protection provided to the epitaxial source/drain features 210A in subsequent etching processes may be insufficient; if the lateral width is too large, such as greater than 7 nm, the additional cost of chip footprint may not be worth the performance enhancement. By contrast, the inner spacers 206B has a lateral width 340B of about 0.5 nm to about 5 nm. In other words, the inner spacer 205A has a lateral width 340A that may be equal to or greater than the lateral width 340B of inner spacer 206B by up to about 6.5 nm. If the lateral width is too small, such as less than 0.5 nm, the inner spacer dimension may suffer poor reliability; if the lateral width is too large, such as greater than 6.5 nm, it may be too close to the lateral width of the inner spacer 206A, such that a balance of capacitance may not be reached. In an embodiment, the inner spacers 206A includes a dielectric material that has a dielectric constant smaller than the dielectric material of the inner spacers 206B. In some embodiments, a ratio of the lateral width 340A to the lateral width 340B may be about 14 to 1.1. If the ratio is too small, such as less than 1.1, the benefit afforded by the balanced capacitance may not justify the extra manufacturing cost associated with fabricating the asymmetric inner spacer structures; if the ratio is too large, such as greater than 14, either device 100A will have to occupy unnecessarily large chip space or the device 100B would suffer fabrication challenges due to its small inner spacer dimension.

In some embodiments, the optimal performance of the nano-sheet-based CMOS also requires overall balanced current flow. For example, a PMOS transistor of a nano-sheet-based CMOS employs holes as the charge carriers, and an NMOS transistor of the same nano-sheet-based CMOS employs electrons as the charge carriers. Because the holes have much smaller mobility than the electrons, a shorter migration path (and therefore a shorter channel length) in the PMOS transistor than that in the NMOS transistor may be required in order to reach the same current flow level, thereby maximizing the maximum available drain current ($I_{on}$). In an embodiment, for example, in a memory cell, the channel length 600A of the PMOS transistor 100A is about 5 nm to about 15 nm. If the channel length is too small, such as less than 5 nm, the gate control of the channel region may be weakened such that leakage may increase; if the channel length is too long, such as greater than 15 nm, the additional cost of chip footprint may not be worth the performance enhancement. By contrast, the channel length 600B of the NMOS transistor 100B is about 10 nm to about 20 nm. In an embodiment, the channel length 600B is greater than the channel length 600A by about 5 nm to about 10 nm. If the channel length is too small, such as less than 10 nm, it may be too close to the channel length of the PMOS transistor 100A, such that a balance of current may not be reached; if the channel length is too large, such as greater than 20 nm, the additional cost of chip footprint may not be worth the performance enhancement. In some embodiments, a ratio of the channel length 600B to the channel length 600A may be about 1.3 to 4. If the ratio is too small, the benefit afforded by the balanced current may not justify the extra manufacturing cost associated with fabricating the asymmetric inner spacer structures; if the ratio is too large, such as greater than 4, either device 100B will have to occupy unnecessarily large chip space or the device 100A would suffer fabrication challenges (such as forming gate components) due to its small channel dimension.

Figure 21A:
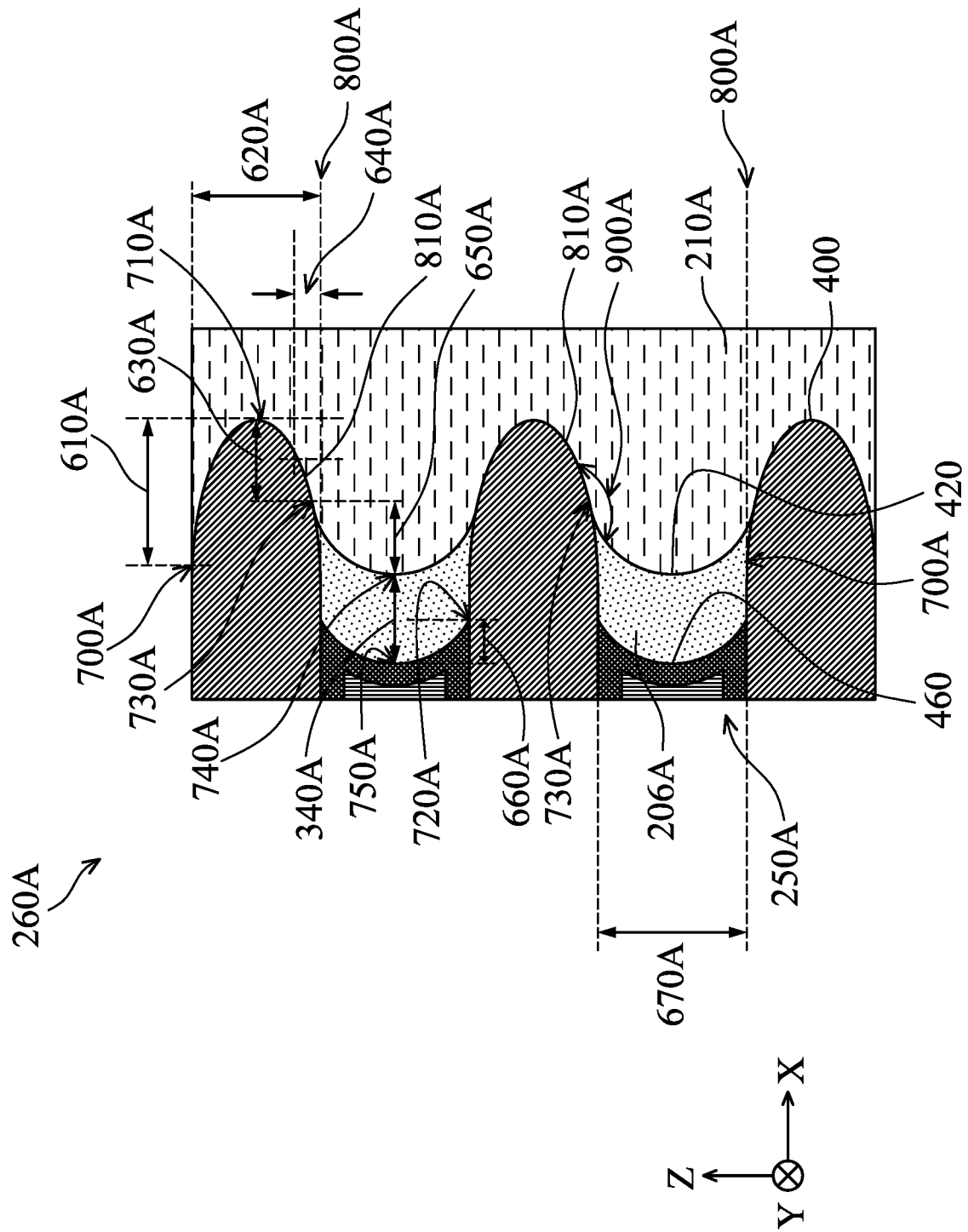
Figure 21B:
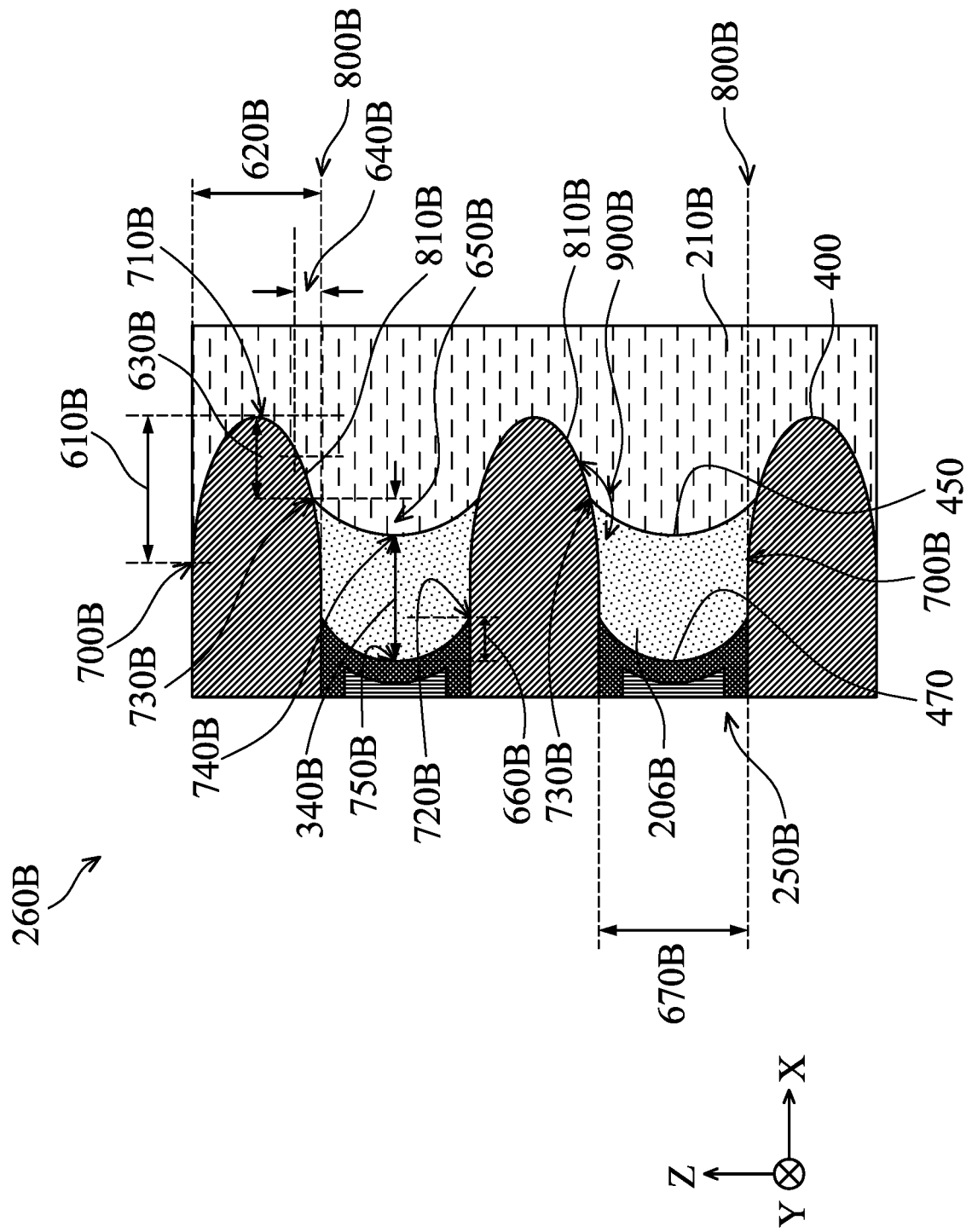

FIG. 21A and FIG. 21B are expanded cross-sectional views of the regions 260A and 260B, respectively, illustrating the dimensions of the surface profiles. In some embodiments, each of the semiconductor layers 120 in the region 260A have the same surface profile, such as the profile for the surface 400. The semiconductor layers 120 may each further have a flat portion of the outer surface, denoted as the portion 800A. As illustrated in FIG. 21A, the surface 400 separates from the portion 800A at the separation point 700A. In some embodiments, the separation point 700A is part of a separation line that extends along the Y-direction. The surface 400 also has a tip point 710A. The horizontal distance along the X-direction between the tip point 710A and the separation point 700A of the same semiconductor layer 120 is the maximum lateral width 610A of the surface 400. In an embodiment, the maximum lateral width 610A is about 0.5 nm to about 4.0 nm. The vertical distance along the Z-direction between the tip point 710A and the separation point 700A of the same semiconductor layer 120 is about half of the thickness 620A of the semiconductor layer 120. In an embodiment, the thickness 620A is about 3 nm to about 8 nm. The semiconductor layer 120 interfaces with the inner spacer 206A at the interface point 730A. In some embodiments, the interface point 730A is part of an interface line that extends between the semiconductor layer 120 and the inner spacers 206A along the Y-direction. In some embodiments, the semiconductor layer 120 also interfaces the epitaxial source/drain features 210A at the same interface point 730A. As illustrated, the semiconductor layers 120 each protrude into the epitaxial source/drain features 210A. For example, referring back to FIG. 8, the process 540A may etch away proper amount of the dielectric material 306A, such that the semiconductor layers 120A each extend more towards the source/drain trenches 208A. The horizontal distance 630A between the tip point 710A and the interface point 730A represent the extent the semiconductor layers 120 protrudes into the epitaxial source/drain features as compared to the inner spacers 206A. It is understood that a proper horizontal distance 630A improves growth condition for the epitaxial source/drain feature 210A. For example, epitaxial source/drain features are known to grow on semiconductor substrates but not on dielectric materials (such that the dielectric materials of the inner spacers 206A). Accordingly, the curved portion of the semiconductor layers 120 protruding into the source/drain trenches 208A provide a larger surface area for improved epitaxial growths. The horizontal distance 630A may be about 0.5 nm to about 2.0 nm.

As illustrated in FIG. 21A, the tip point 710A and the interface point 730A define a portion of the surface 400 denoted as 810A. The curvature of the portion 810A may be described by the vertical separation distance 640A between the portion 810A and the portion 800A along the Z-direction at the midpoint position along the X-direction between the tip point 710A and the interface point 730A. In an embodiment, the vertical separation distance 640A is about 0.2 nm to about 2.0 nm.

As described above, the inner spacer 206A may have a curved surface 420 facing the epitaxial source/drain features 210A. The surface 420 may have a tip point 740A. The curvature of the surface 420 may be described by the horizontal distance 650A along the X-direction between the interface point 730A and the tip point 740A, as compared to the thickness 670A of the gate structure between the semiconductor layers 120. In an embodiment, the horizontal distance 650A is less than about 2 nm. The thickness 670A of the gate structure between the semiconductor layers 120 are largely determined by the thickness of the original semiconductor layer 110. In other words, the thickness 670A is similar to the thickness 300. In an embodiment, the process 580A slightly etches away the semiconductor layer 120. Therefore, the thickness 670A is slightly greater than the thickness 300. For example, the thickness 670A is about 1% to about 10% greater than the thickness 300. In an embodiment, the thickness 670A is about 8 nm to about 15 nm.

The inner spacer 206A may also have a curved surface 460 facing the gate structure 250A. In other words, the inner spacer 206A may have a concave surface 460 protruding towards the gate structure 250A along the X-direction. Accordingly, the gate structure has a concave end surface 460 that protrudes inwardly along the X-direction. The surface 460 interfaces with the portion 800A at an interface point 720A. In some embodiments, the interface point 720A may be part of an interface line that extends between the semiconductor layer 120 and the inner spacer 206A along the Y-direction. The surface 460 may also have a tip point 750A. The curvature of the surface 460 may be described by the horizontal distance 660A along the X-direction between the interface point 720A and the tip point 750A, as compared to the thickness 670A of the gate structure 250A between the adjacent semiconductor layers. In an embodiment, the horizontal distance 660A is less than about 2 nm. The curvature of the surface 460 may be the same as or different from the curvature of the surface 420. When the curvatures are the same, the inner spacers 206A has uniform lateral width 340A across its height; when the curvatures are different, the inner spacers 206A has varying lateral widths across its height along the Z-direction, and the lateral width 340A represents the average lateral width.

The portion 810A and the surface 420 (the interface between the inner spacer 206A and the epitaxial source/drain features 210A) intersect at the interface point 730A (or the interface line that extends through the interface point 730A) and form an angle 900A. As depicted, the angle 900A is greater than 90°. The inventors of the present disclosure have discovered that, when the angle 900A is smaller than or about equal to 90°, it is difficult to properly fill the entire space between the portion 810A and the surface 420 with epitaxial materials. Accordingly, voids (or seams) may be formed in that region. By contrast, the present embodiment of the method 10 allows the angle 900A to be greater than 90°. Therefore, the epitaxial source/drain features 210A more easily and more reliably fill the entire space spanning the angle 900A without leaving voids (or seams). In some embodiments, the profile of the surface 400 is at least partially determined by the process 520A (see FIG. 6). As described above, although the semiconductor layers 120 have small etching rate during the process 520A, the process 520A nevertheless reshapes the profiles of the semiconductor layers 120, resulting in the curved surface 400. Accordingly, the profile of the surface 400 may be tuned by selecting the appropriate etching methods and adjusting etching parameters. For example, a wet etching process and/or a high-temperature chemical etching process may result in a more curved surface; while a low-temperature etching process may result in less curved surface.

With respect to the region 260B, it shares many similar parameters and characteristics as the region 260A. For example, the semiconductor layers 120 may have curved surfaces 430, and the inner spacers 206B may have curved surfaces 450 and 470, interfacing with the epitaxial source/drain features 210B and gate structure 250B, respectively. The surfaces 430, 450, and 470 may have the same profile or different profiles between each other. For example, the surfaces 430, 450, and 470 may have the same curvatures or different curvatures among them. Additionally, the surface 430 may have the same curvature as, or different curvature from, that of the surface 400; the surface 450 may have the same curvature as, or different curvature from, that of the surface 420; the surface 470 may have the same curvature as, or different curvature from, that of the surface 460. In the depicted embodiment, the surfaces 430 and 470 have the same curvature as the surfaces 400 and 460, respectively. Accordingly, various aspects for these surfaces (such as denotations and dimensions) are similar between the regions 260A and 260B. For example, the maximum lateral width 610B may be about the same as the maximum lateral width 610A; the thickness 620B may be the same as the thickness 620A; the semiconductor layers 120 in region 260B also protrude into the epitaxial source/drain features 210B as they protrude into the epitaxial source/drain features 210A; the gate structure 250B also has a concave end surface 470 that protrudes inwardly along the X-direction. However, in the depicted embodiment, the surface 450 has a different curvature from that of the surface 420. This is described in more detail below.

As depicted, the inner spacer 206B interfaces with the epitaxial source/drain feature 210B at the surface 450. Additionally, the inner spacer 206B interfaces with the semiconductor layer 120 at the interface point 730B. In some embodiments, the interface point 730B is part of an interface line that extends between the semiconductor layer 120 and the inner spacers 206B. In some embodiments, the semiconductor layer 120 also interfaces the epitaxial source/drain features 210B at the same interface point 730B. The surface 450 may have a tip point 740B. The curvature of the surface 450 may be described by the horizontal distance 650B along the X-direction between the interface point 730B and the tip point 740B of the same semiconductor layer 120, as compared to the thickness 670B of the gate structure 250B between the adjacent semiconductor layers. In an embodiment, the horizontal distance 650B is less than about 2 nm. In the depicted embodiment, the horizontal distance 650B is smaller than the horizontal distance 650A, while the thickness 670B of the gate structure between the channel layers is about the same as the thickness 670A. In other words, the curvature of the surface 450 is smaller than the curvature of the surface 420. However, in other embodiments, the curvature of the surface 450 may be larger than or about equal to that of the surface 420. Additionally, the curvature of the surface 450 is also smaller than the curvature of the surface 470 in the depicted embodiment. However, in other embodiments, the curvature of the surface 450 may be larger than or about equal to the curvature of the surface 470. As described above, the distance between the surfaces 470 and 450 is the lateral width 340B of the inner spacers 206B. When the curvatures of the surfaces 470 and 450 are different, the lateral width 340B represents the average lateral width of the inner spacers 206B. In an embodiment, the lateral width 340B is less than about 5 nm. Accordingly, the lateral width 340B of the NMOS transistor 100B may be smaller than the lateral width 340A of the PMOS transistor 100A.

Similar to corresponding features of region 260A, the portion 810B (defined by the tip point 710B and the interface point 730B on the surface 430) and the surface 450 (the interface between the inner spacer 206B and the epitaxial source/drain features 210B) intersect at the interface point 730B (or the interface line that extends through the interface point 730B) and form an angle 900B. As depicted, the angle 900B, is greater than 90°. Accordingly, like the situation with respect to the angle 900A, much of the difficulty in filling sharp angles with epitaxial semiconductor material is avoided, and no voids (or seams) are formed in the region spanning the angle 900B. As described above, the profile of the surface 430 may be tuned during the process 520B (see FIG. 6) by selecting the appropriate etching methods and adjusting etching parameters. For example, a wet etching process and/or a high temperature chemical etching process may result in a more curved surface, while low temperature etching process may result in a less curved surface. Accordingly, the curvature of the surface 430 as formed is smaller than the curvature of the surface 400.

The disclosure above describes the embodiment 10A of the method 10. The embodiment 10B of the method 10 shares the same processing steps 12-30 of embodiment 10A, as illustrated in FIG. 2A. Further, FIG. 2C and FIGS. 22-27 illustrate processing steps 32B-44B, which may be different from the embodiment 10A. In other words, embodiment 10B of the method 10 proceeds from the processing step 30 to 32B and through 44B. Because these subsequent steps 32B-44B share many same or similar characteristics as the processing steps 32A through 46A already described above, the descriptions below are abbreviated for simplicity and conciseness.

Figure 22:
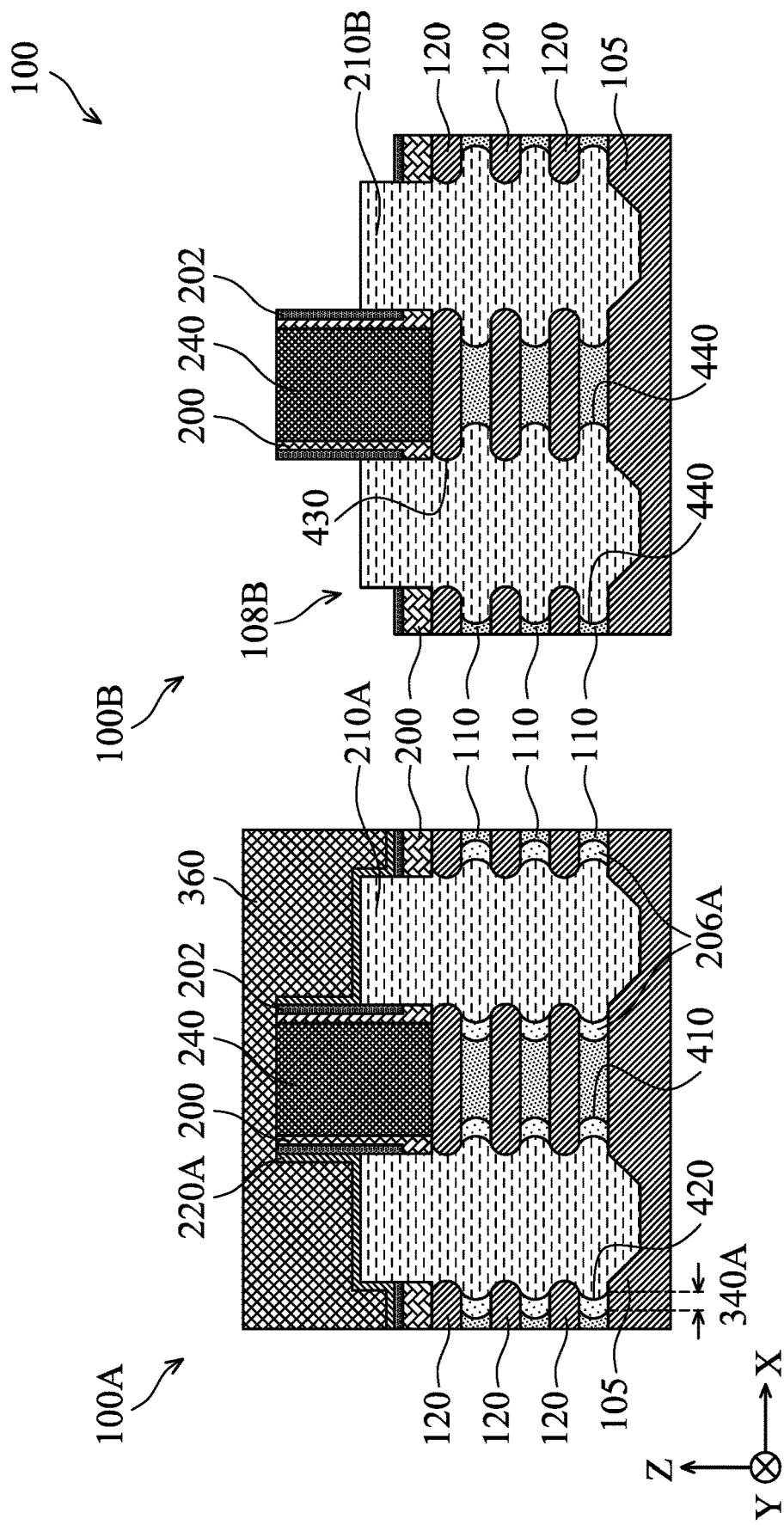
Figure 23:
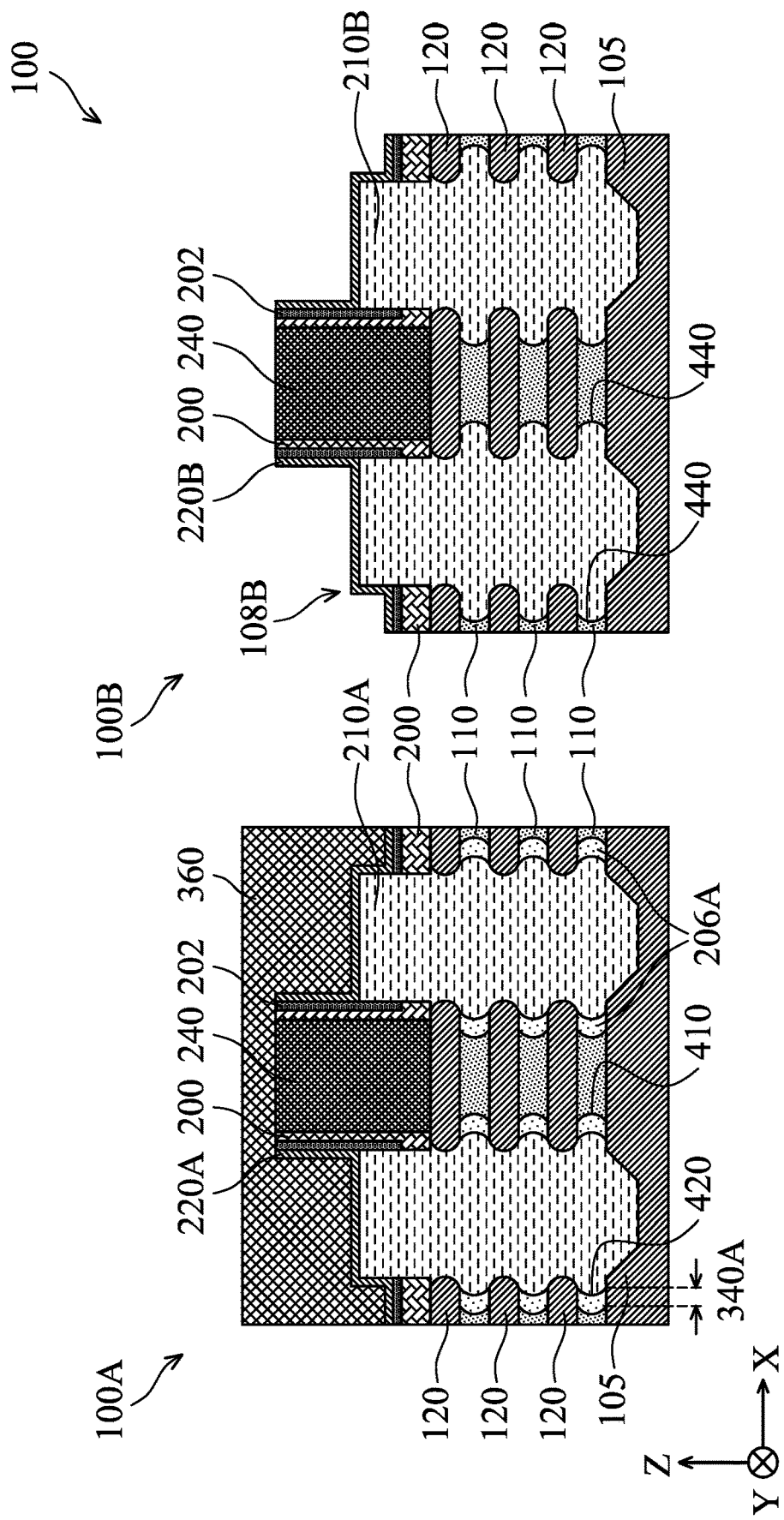
Figure 24:
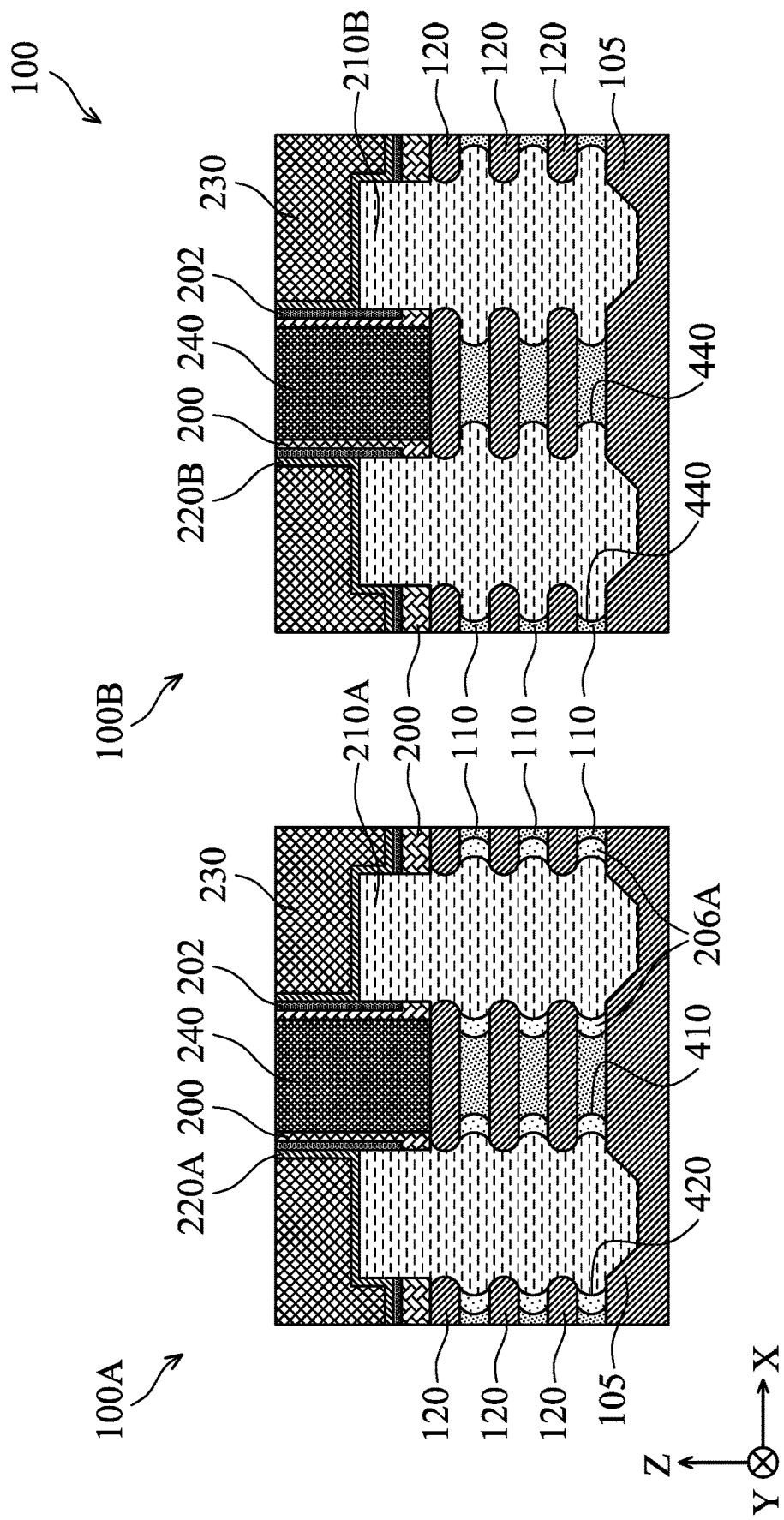
Figure 25:
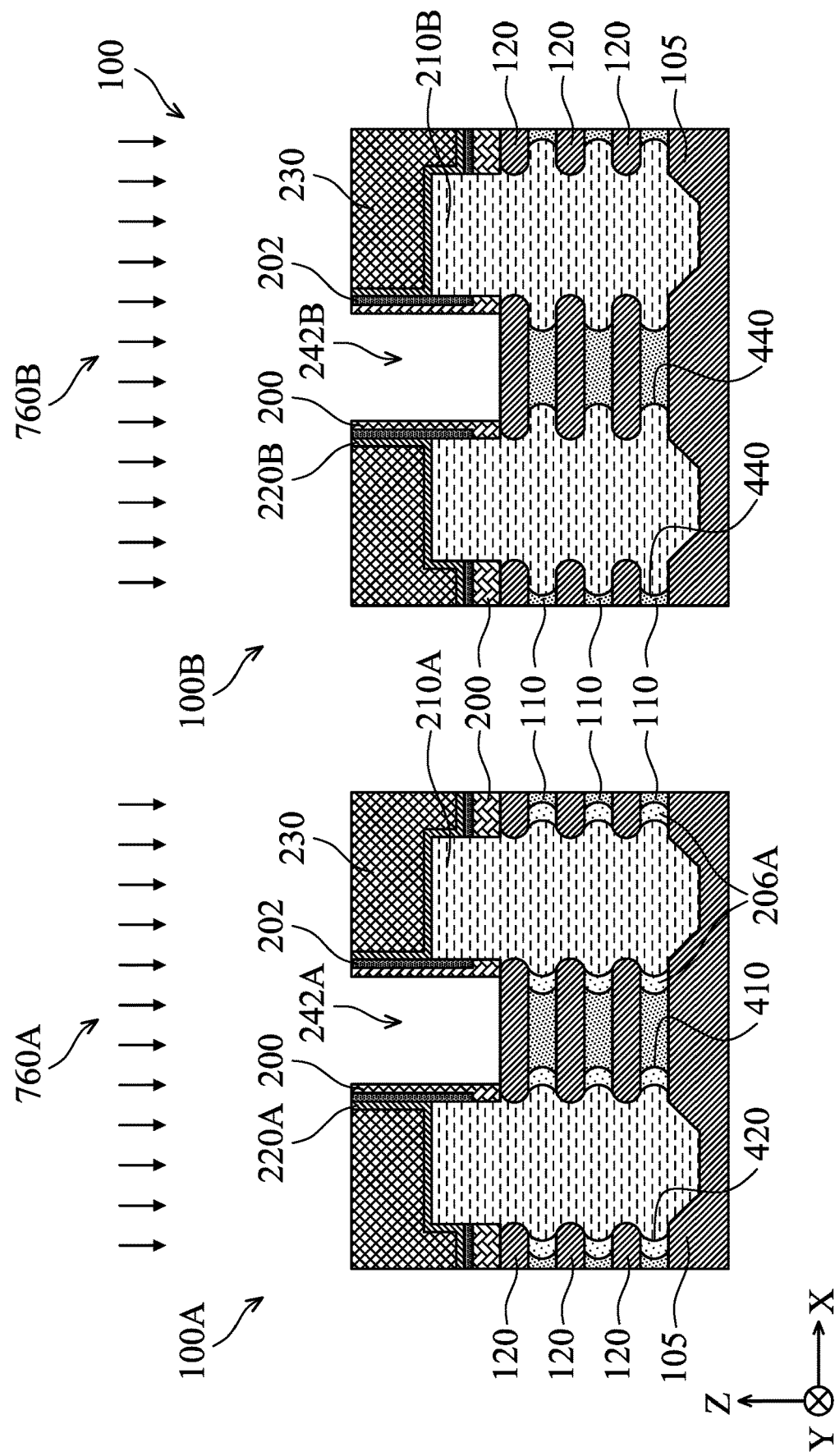
Figure 26:
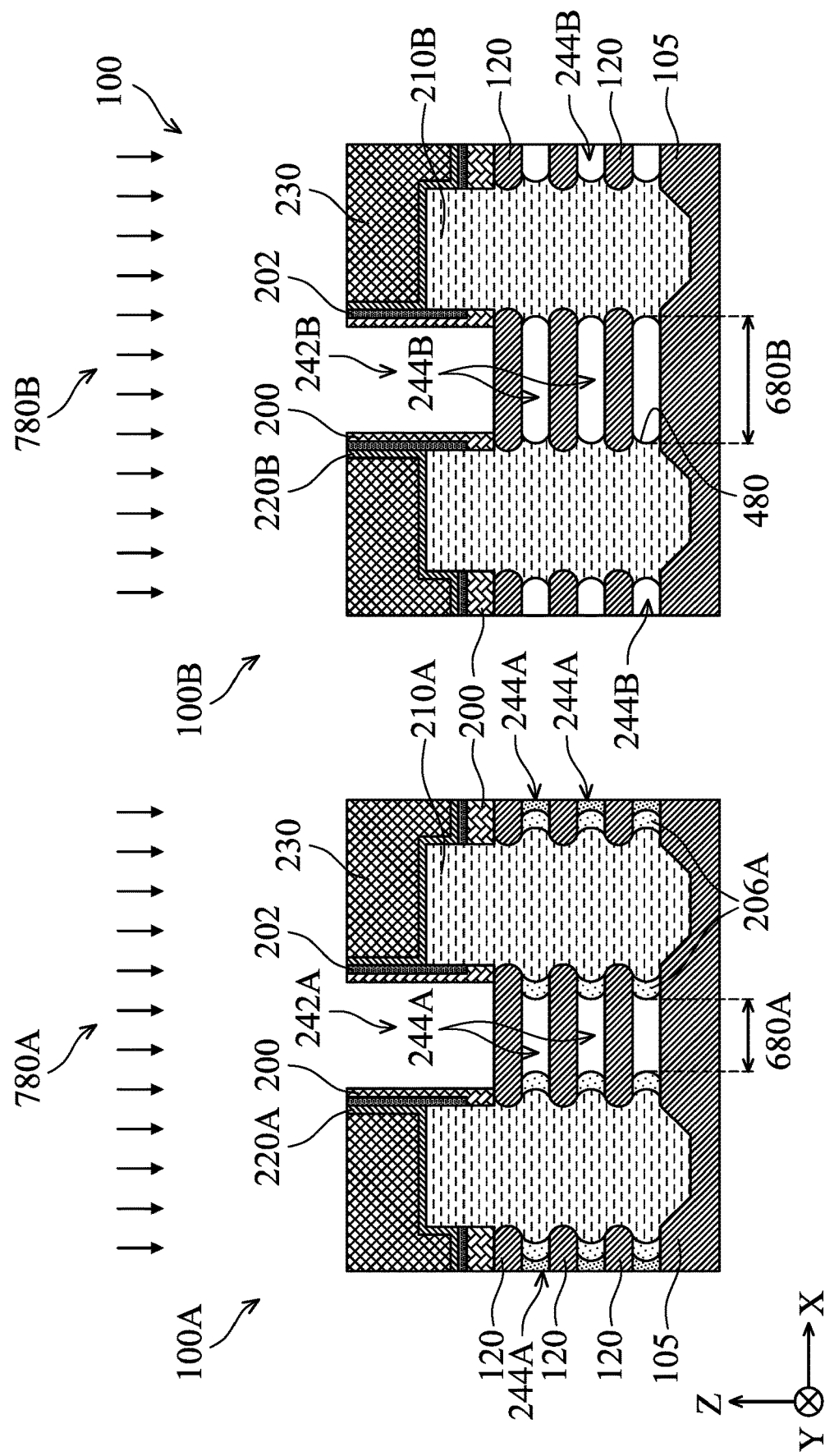

Referring to block 32B of FIG. 2C and FIG. 22, epitaxial source/drain features 210B are formed in the source/drain trenches 204B (illustrated in FIG. 12). There are some differences from the embodiment 10A of the method 10. In the embodiment 10A, a dielectric material 306A is deposited into the source/drain trenches 204B before forming the epitaxial source/drain features 210A; and a portion of the dielectric material 306A later forms the inner spacer 206A. By contrast, these steps are omitted in the embodiment 10B. In other words, no inner spacer is formed in embodiment 10B. Accordingly, the epitaxial source/drain features 210B directly interface with the semiconductor layers 110 at the surface 440. In other aspects, the epitaxial source/drain features 210B here generally resemble the epitaxial source/drain features 210B of embodiment 10A (and resemble the epitaxial source/drain features 210A except that they may be doped with an n-type dopant rather than a p-type dopant). Additionally, the processing step of block 34B of FIG. 2D resembles the processing step of 32A of FIG. 2B. Also similar to the embodiment 10A, an optional contact etch stop layer 220 may be formed over the epitaxial source/drain features 210B (see FIG. 23).

Furthermore, the processing steps 34B-44B of FIG. 2C of embodiment 10B generally resemble the processing steps 36A-46A of FIG. 2B of embodiment 10A. For example, an ILD layer 230 is formed over both the regions configured for the PMOS transistor 100A and the regions configured for the NMOS transistor 100B (see block 34B of FIG. 2D and FIG. 24); the dummy gate structures 240 are removed from both regions by processes 760A and 760B and forming the gate trenches 242A and 242B respectively (see FIG. 25); the remaining portions of the semiconductor layers 110 are removed from both regions by processes 780A and 780B and forming openings 244A and 244B, respectively (see block 36B-38B of FIG. 2D and FIG. 26). However, because of the absence of the inner spacer in the region configured for the NMOS transistor 100B, the openings 244A and 244B may have different profiles. In an embodiment, referring to FIG. 26, the process 780A is configured such that the process removes substantially all remaining portions of the semiconductor layers 110 without substantially affecting the inner spacers 206A. For example, the semiconductor material of the semiconductor layers 110 may be etched away at a substantially faster rate in the selected etching chemical than the dielectric material 306A of the inner spacers 206A. In other words, the etching selectivity largely determines the extent of etching on the PMOS side. By contrast, the semiconductor layers 110 interface directly with the epitaxial source/drain features 210B in the region configured for the NMOS transistor 100B. The extent of etching there may be controlled by adjusting the duration of the etching. In the depicted embodiment, the process 780B may result in a curved surface 480. The curved surface 480 may face an opposite direction as the curved surface 440 (compare FIG. 22). In other words, the openings 244B may have a width greater at the midpoint of its height along the Z-direction than at the topmost and at the bottommost height along the Z-direction. Accordingly, the curved surface 480 may include the semiconductor material of the semiconductor layers 110, the semiconductor materials of the epitaxial source/drain features 210B, or both. In some implementations, a small portion of the semiconductor layers 110 remain after the process 780B. In some other implementations, the entirety of the semiconductor layers 110 are removed, along with a small portion of the epitaxial source/drain features 210B. The average length of the openings 244B along the X-direction, denoted as 620B, largely determines the channel length of the NMOS transistor 100B, as described in more details below.

Figure 27:
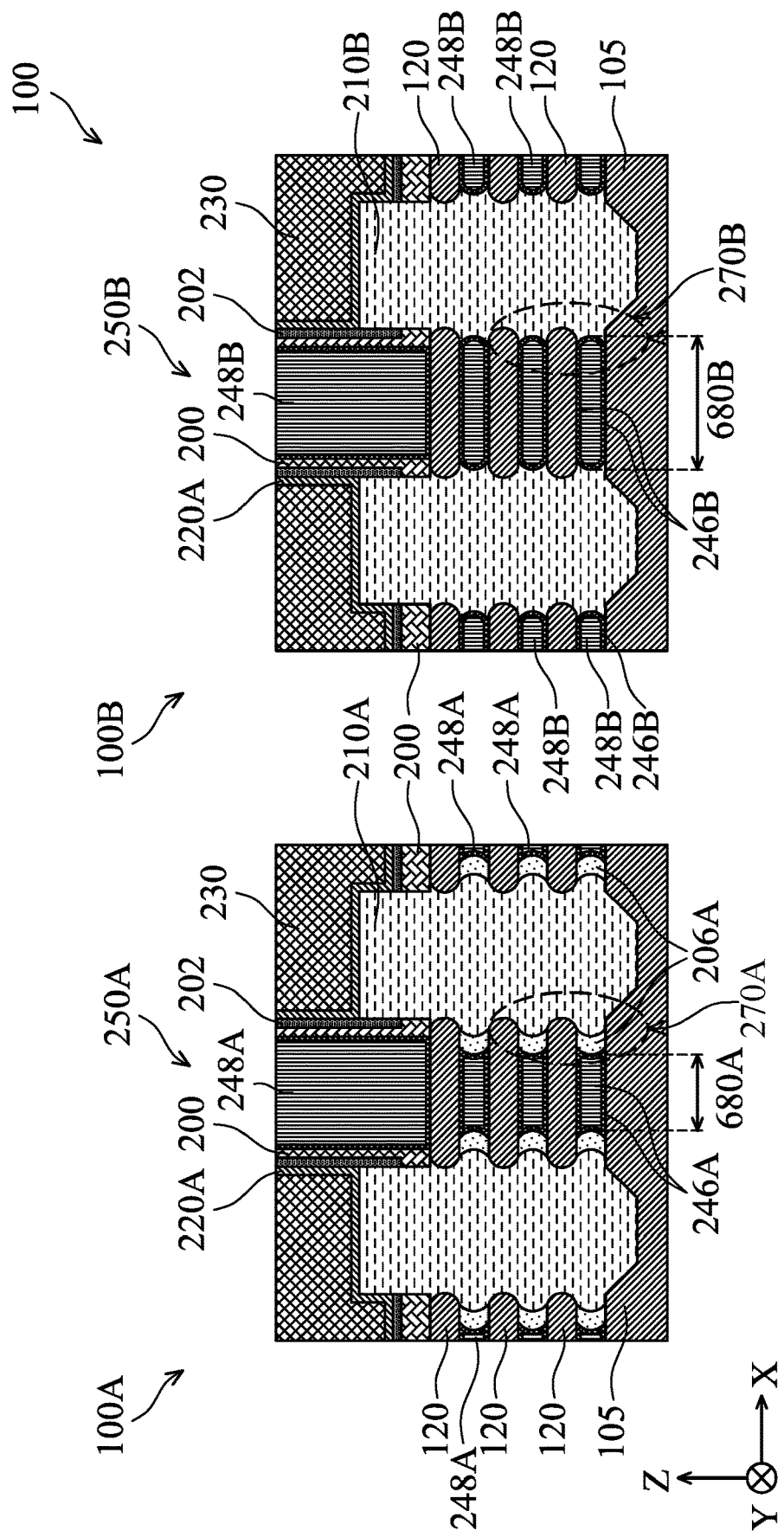

Referring to blocks 40B and 42B of FIG. 2D and FIG. 27, a gate structure 250A is formed in the openings 244A and the gate trenches 242A of the PMOS transistor 100A; a gate structure 250B is formed in the openings 244B and the gate trenches 242B of the NMOS transistor 100B. Similar to the embodiment 10A already discussed above, the gate structure 250A includes a gate dielectric layer 246A and a conductive metal layer 248A; the gate structure 250B includes a gate dielectric layer 246B and a conductive metal layer 248B. In some embodiments, these layers each include materials similar to or the same as those already described above in the context of the embodiment 10A. The gate structure 250A has a channel length 680A. The channel length 680A may be similar to, or same as, the length 600A for embodiment 10A. The gate structure 250B has a channel length 680B. The channel length 680B may be similar to, or same as, the channel length 600B for embodiment 10A. Additionally, as illustrated in FIG. 27, the region 270A includes a capacitor, similar to the region 260A described above with respect to embodiment 10A; however, the region 270B does not include a similar capacitor, which is different from the region 260B described above in the context of embodiment 10A. For example, the gate structure 250B (including a conductive material) directly interfaces the epitaxial source/drain features 210B (including another conductive material). Furthermore, the gate structure 250B has an end concave surface 480 that protrudes outwardly, as opposed to inwardly for the gate structure 250A, along the X-direction. It is understood that one purpose of the inner spacers is to protect the epitaxial source/drain features during subsequent processes (such as etching processes to form contact holes). However, the n-type doped epitaxial source/drain features 210B may have a different sensitivity to such subsequent processes from the p-type doped epitaxial source/drain features 210A. For example, without the protection from the inner spacers, the p-type doped epitaxial source/drain features 210A may be relatively easily etched (thereby damaged) in such subsequent processes; while the n-type doped epitaxial source/drain features 210B may be more resistant to such subsequent processes under the same condition. Accordingly, in some embodiments, the inner spacers may not be necessary and can be omitted for the NMOS transistor 100B.

Figure 28A:
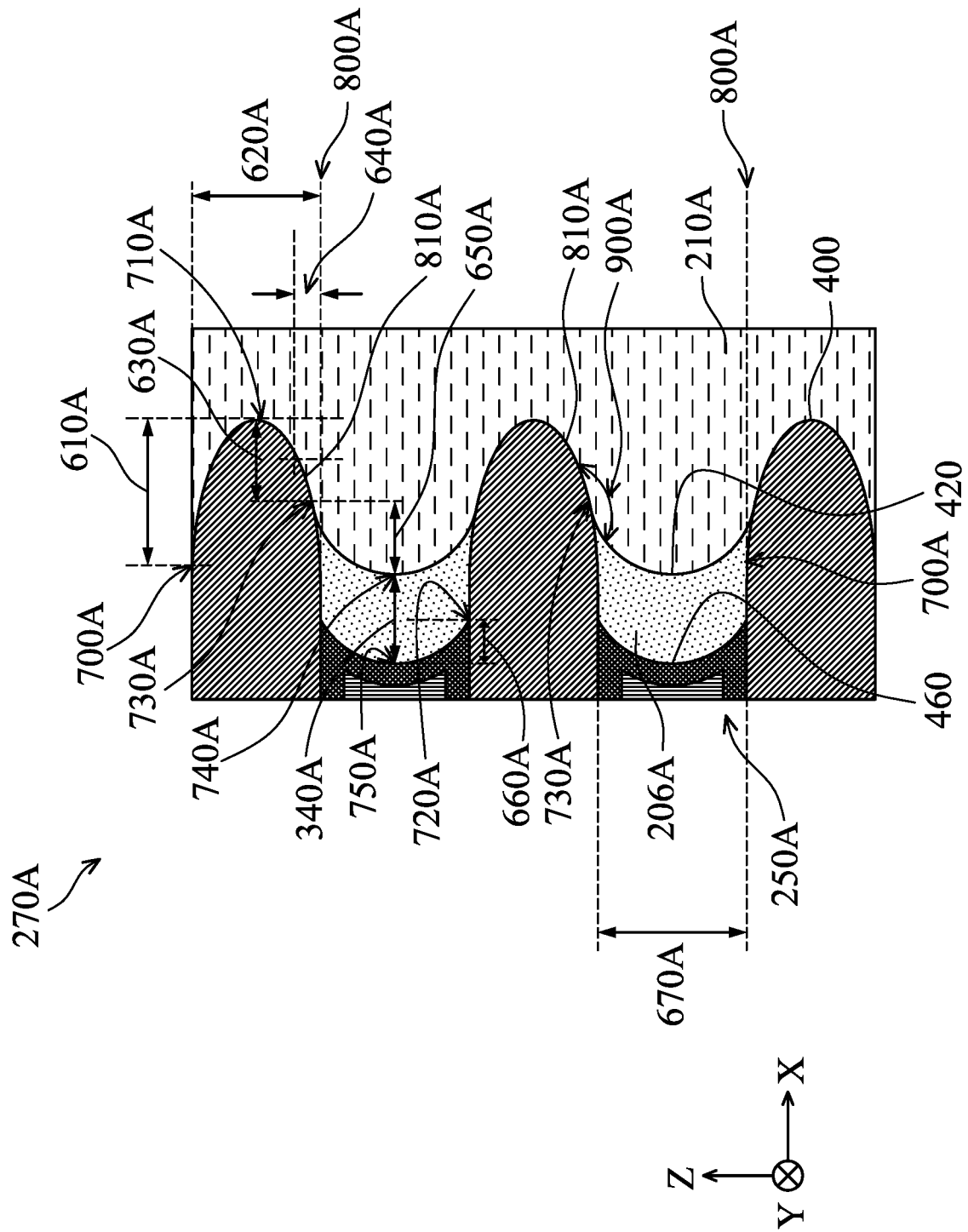
Figure 28B:
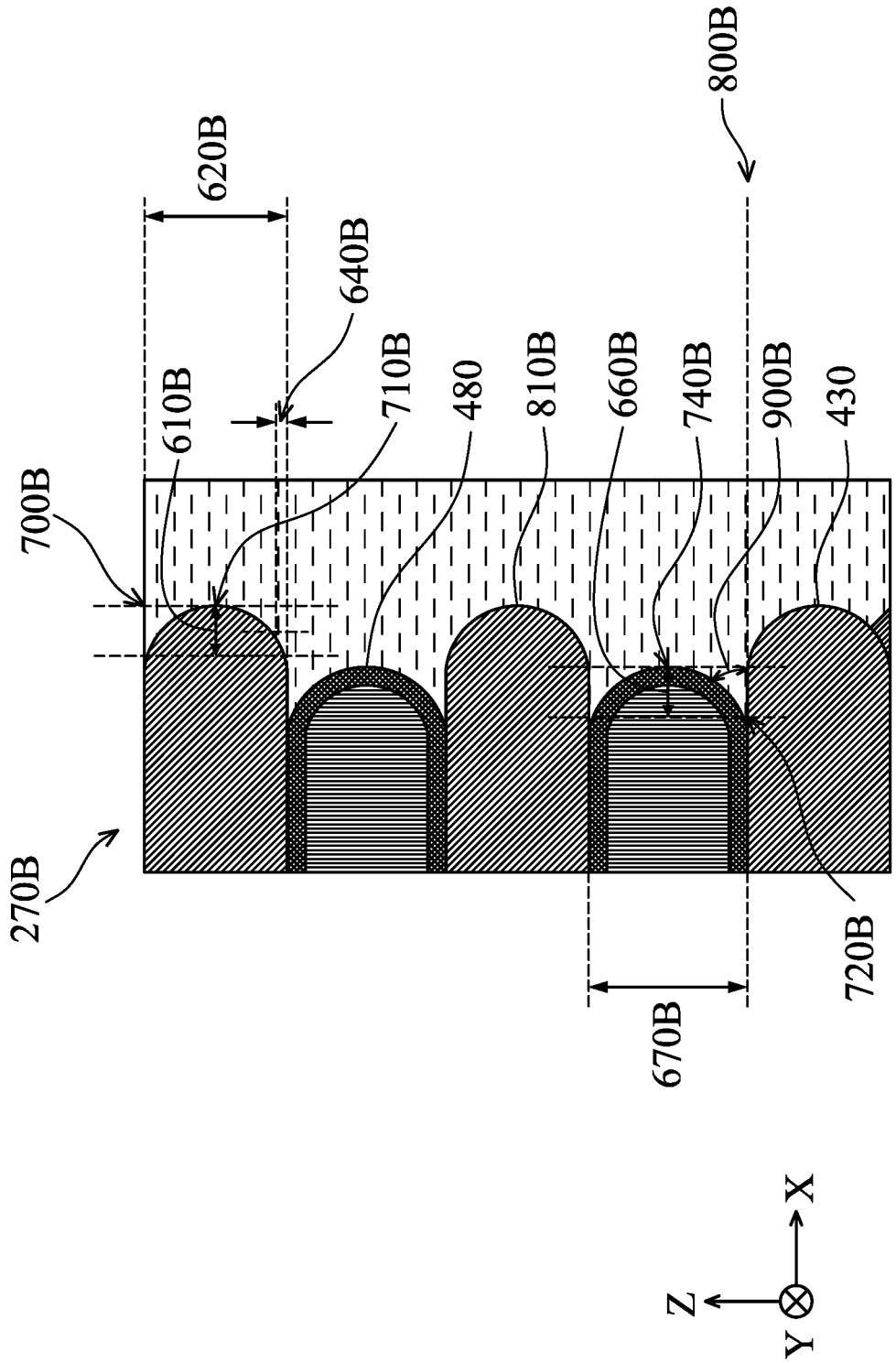

FIGS. 28A and 28B are expanded cross-sectional views of the regions 270A and 270B, respectively, illustrating the dimensions of the surface profiles. The region 270A substantially resembles the region 260A of embodiment 10A; while the region 270B differs from the region 260B. With respect to the region 270A, as described above for the region 260A, the semiconductor layers 120 may have curved surfaces 400, and the inner spacers 206A may have curved surfaces 420 and 460, interfacing with the epitaxial source/drain features 210A and gate structure 250A, respectively. The surfaces 400, 420, and 460 may have the same profile or different profiles. For example, the surfaces 400, 420, and 460 may have the same curvatures or different curvatures.

With respect to the region 270B, the structure differs substantially from that of the region 270A or the region 260B of the embodiment 10A. In some embodiments, each layer of the semiconductor layers 120 share the same surface profile as the surface 430. In addition, the semiconductor layers 120 each have a flat portion of the outer surface, denoted as the portion 800B. As illustrated in FIG. 28B, the surface 430 separates from the portion 800B at the separation point 700B. In some embodiments, the separation point is part of a separation line that extends along the Y-direction. The surface 430 also has a tip point 710B. The horizontal distance along the X-direction between the tip point 710B and the separation point 700B of the same semiconductor layer 120 is the maximum lateral width 610B of the surface 430. In an embodiment, the maximum lateral width 610B is about 0.5 nm to about 4.0 nm. The vertical distance along the Z-direction between the tip point 710B and the separation point 700B of the same semiconductor layer 120 is about half of the thickness 620B of the semiconductor layer 120. In an embodiment, the thickness 620B may be the same as the thickness 620A. For example, the thickness 620A is about 3 nm to about 8 nm.

The gate structure 250B interfaces the semiconductor layers 120B at the portion 800B. Additionally, the gate structure 250 interfaces the epitaxial source/drain features 210B at the surface 480. The surface 480 and the portion 800B diverge (or separate) from each other at the separation point 720B. In some embodiments, the separation point 720B is part of a separation line that extend between the surface 480 and the portion 800B along the Y-direction. Additionally, the surface 480 has a tip point 740B. The horizontal distance between the separation point 720B and the tip point 740B is the maximum lateral width 660B of the surface 480. The curvature of the surface 480 is described by the maximum lateral width 660B as compared to the thickness 670B of the gate structure 250B. As illustrated, the semiconductor layers 120 protrude into the epitaxial source/drain features 210B such that they each extend wider than the gate structures 250B.

As illustrated in FIG. 28B, the tip point 710B and the separation point 720B define a portion of the surface 430 denoted as 810B. The curvature of the portion 810B may be described by the vertical separation distance 640B between the portion 810B and the portion 800B along the Z-direction at the midpoint position along the X-direction between the tip point 710B and the separation point 700B. In an embodiment, the vertical separation distance 640B is about 0.2 nm to about 2.0 nm.

As described above, the gate structure 250B may have a curved surface 480 facing the epitaxial source/drain features 210B. The surface 480 may have a tip point 740B. The curvature of the surface 480 may be described by the horizontal distance 660B along the X-direction between the separation point 720B and the tip point 740B of the same semiconductor layer 120, as compared to the thickness 670B of the gate structure 250B between the semiconductor layers 120. In an embodiment, the horizontal distance 660B is less than about 2 nm. The thickness 670B of the gate structure between the semiconductor layers 120 are largely determined by the thickness of the original semiconductor layer 110. In other words, the thickness 670B is similar to the thickness 300 and the thickness 670A. In an embodiment, the thickness 670B is about 8 nm to about 15 nm.

The portion 800B and the surface 480 intersect at the separation point 720B and form an angle 900B. As depicted, the angle 900B is less than 90°. The angle 900B is partially determined by the profile of the surface 480, which is at least partially determined by the process 780B (see FIG. 26). Accordingly, the magnitude of the angle 900B may be tuned by selecting the appropriate etching methods and adjusting etching parameters. For example, a wet etching process may result in more curved surface, while a gas phase chemical etching process may result in less curved surface.

Though not intended to be limiting, embodiments of the present disclosure offer benefits for semiconductor processing and semiconductor devices. For example, the disclosed method allows the PMOS transistor and the NMOS transistor of a nano-sheet-based CMOS device to include inner spacers of different materials, dimensions, and/or surface profiles. For another example, the disclosed method allows the PMOS transistor to include an inner spacer, while the NMOS transistor to not include an inner spacer. Thus, the PMOS and NMOS transistors are afforded great flexibility in tuning the parameters to optimize its performance in order to balance with each other. As a result, better capacitance balance and/or better current balance may be achieved for the nano-sheet-based CMOS device. As such, the present disclosure provides methods that improve the performance, functionality, and/or reliability of nano-sheet-based transistors.

In an exemplary aspect, the present disclosure is directed to a semiconductor device. The semiconductor device includes a semiconductor substrate, a first pair of source and drain features and a second pair of source and drain features over the semiconductor substrate, a first stack of semiconductor layers and a second stack of semiconductor layers, a first gate and a second gate. The first pair of source and drain features are p-type doped; and the second pair of source and drain features are n-type doped. The first stack of semiconductor layers connect the first pair of source and drain features along a first direction. The second stack of semiconductor layers connect the second pair of source and drain features along a second direction. The first gate has a first portion between vertically adjacent layers of the first stack of semiconductor layers. The second gate has a second portion between vertically adjacent layers of the second stack of semiconductor layers. The first portion has a first dimension along the first direction, and the second portion has a second dimension along the second direction. The second dimension is larger than the first dimension.

In some embodiments, the first portion has a concave end surface protruding inwardly along the first direction, and the second portion has a concave end surface protruding outwardly along the second direction. In some embodiments, the semiconductor device further includes a first inner spacer. The first inner spacer has a third dimension along the first direction and connects the first portion and one of the first pair of source and drain features. In some embodiments, a layer of the first stack of semiconductor layers includes a region where a material of the layer, a material of the first inner spacer, and a material of the one of the first pair of source and drain features are interfaced with one another. In some embodiments, the fourth dimension is smaller than the third dimension. In some embodiments, the first dimension is about 5 nm to about 15 nm, the second dimension is about 10 nm to about 20 nm, the third dimension is about 5 nm to about 7 nm, and the fourth dimension is about 0.5 nm to about 5 nm. In some embodiments, the first inner spacer includes a first material, the second inner spacer includes a second material, and the second material is different from the first material. In some embodiments, the first inner spacer has a first interface with the one of the first pair of source and drain features; the second inner spacer has a second interface with the one of the second pair of source and drain features. The first interface has a first surface profile, the second interface has a second surface profile. The second surface profile is different from the first surface profile. In some embodiments, the first stack of semiconductor layers are stacked along a third direction perpendicular to the first direction. A first layer of the first stack of semiconductor layers has a rounded end portion and a middle portion. The rounded end portion protrudes from an edge of the first inner spacer into the one of the first pair of source and drain features along the first direction by a first length. The first length is about 0.5 nm to about 2 nm. The middle portion is in between and directly contacts two adjacent portions of the first gate. The rounded end portion has a first thickness along the third direction at the midpoint of the first length. The middle portion has a second thickness along the third direction. A first thickness difference between the first thickness and the second thickness is about 1 nm to about 4 nm. In some embodiments, the second stack of semiconductor layers are stacked along a fourth direction perpendicular to the second direction. A second layer of the second stack of semiconductor layers has a rounded end portion and a middle portion. The rounded end portion protrudes from an edge of the second inner spacer into the one of the second pair of source and drain features along the second direction by a second length. The middle portion is in between and directly contacting two adjacent portions of the second gate. The rounded end portion has a third thickness along the fourth direction at the midpoint of the second length. The middle portion has a fourth thickness along the fourth direction. A second thickness difference between the third thickness and the fourth thickness is different from the first thickness difference.

In an exemplary aspect, the present disclosure is directed to a method. A structure is received. The structure includes a semiconductor substrate, a first stack of first semiconductor layers and second semiconductor layers over the semiconductor substrate, a second stack of third semiconductor layers and fourth semiconductor layers over the semiconductor substrate, a first dummy gate structure over the first stack, and a second dummy gate structure over the second stack. The first semiconductor layers and the second semiconductor layers have different material compositions and alternate with one another within the first stack. The third semiconductor layers and the fourth semiconductor layers have different material compositions and alternate with one another within the second stack. A first portion of the first stack on two sides of the first dummy gate is removed to form a first pair of source/drain trenches, thereby exposing a pair of first side surface of the first stack. A first portion of the first semiconductor layers is removed from the exposed pair of first side surfaces to form first gaps. A first inner spacer is formed in the first gaps, where the first inner spacer has a first dimension along a direction connecting the first pair of source/drain trenches. A first pair of source/drain features are epitaxially grown in the first pair of source/drain trenches. A first portion of the second stack on two sides of the second dummy gate is removed to form a second pair of source/drain trenches, thereby exposing a pair of second side surfaces of the second stack. A first portion of the third semiconductor layers is removed from the exposed second side surfaces to form second gaps. A second inner spacer is formed in the second gaps, where the second inner spacer has a second dimension along a direction connecting the second pair of source/drain trenches. The second dimension is different from the first dimension. A second pair of source/drain features are epitaxially grown in the second pair of source/drain trenches. The first and the second dummy gate structures are removed to form a first gate trench over the first stack and a second gate trench over the second stack, respectively. The second portion of the first semiconductor layers are removed from the first gate trench. A second portion of the third semiconductor layers is removed from the second gate trench. A first gate electrode is formed in the first gate trench. A second gate electrode is formed in the second gate trench.

In some embodiments, the epitaxially growing of the first pair of source/drain features includes epitaxially growing the first pair of source/drain features and doping the first pair of source/drain features with an n-type dopant; the epitaxially growing of the second pair of source/drain features includes epitaxially growing the second pair of source/drain features and doping the second pair of source/drain features with a p-type dopant; and the forming of the second inner spacer includes forming the second inner spacer with the second dimension larger than the first dimension. In some embodiments, the removing of the first portion of the first semiconductor layers includes removing with a first etching method; the removing the first portion of the third semiconductor layers includes removing with a second etching method. The second etching method differs from the first etching method. In some embodiments, the forming of the second inner spacer includes forming the second inner spacer with a material different from a material of the first inner spacer. In some embodiments, the forming of the second inner spacer includes forming the second inner spacer with a surface profile different from a surface profile of the first inner spacer. In some embodiments, the epitaxially growing of the first pair of source/drain features includes growing on a first interface between the first inner spacer and a layer of the first semiconductor layers such that one of the first pair of source/drain features directly contacts the first interface; and the epitaxially growing of the second pair of source/drain features includes growing on a second interface between the second inner spacer and a layer of the third semiconductor layers such that one of the second pair of source/drain features directly contacts the second interface. In some embodiments, the forming of the first gate electrode includes forming the first gate electrode in contact with surfaces of the first inner spacer, and the forming of the second gate electrode includes forming the second gate electrode in contact with surfaces of the second inner spacer.

In an exemplary aspect, the present disclosure is directed to a method. A structure is received. The structure includes a semiconductor substrate, a first stack of first semiconductor layers and second semiconductor layers over the semiconductor substrate, a second stack of third semiconductor layers and fourth semiconductor layers over the semiconductor substrate, a first dummy gate structure over the first stack, and a second dummy gate structure over the second stack. The first semiconductor layers and the second semiconductor layers have different material compositions and alternate with one another within the first stack. The third semiconductor layers and the fourth semiconductor layers have different material compositions and alternate with one another within the second stack. A first portion of the first stack on two sides of the first dummy gate structure is removed to form a first pair of source/drain trenches, thereby exposing a pair of first side surfaces of the first stack. A first portion of the first semiconductor layers is removed from the exposed pair of first side surfaces to form first gaps. First inner spacers are formed in the first gaps. The first inner spacers each has a first dimension along a first direction connecting the first pair of source/drain trenches. A first pair of source/drain features are epitaxially grown in the first pair of source/drain trenches, such that the first pair of source/drain features each directly contacts with one of the first inner spacers. A first portion of the second stack on two sides of the second dummy gate structure is removed to form a second pair of source/drain trenches, thereby exposing a pair of second side surfaces of the second stack. A first portion of the third semiconductor layers is removed from the exposed pair of second side surfaces to form second gaps. A second pair of source/drain features are grown in the second pair of source/drain trenches, such that the second pair of source/drain features each directly contacts with a side surface of a second portion of the third semiconductor layers. The first and the second dummy gate structures are removed to form a first gate trench over the first stack and a second gate trench over the second stack, respectively. A second portion of the first semiconductor layers is removed from the first gate trench. The second portion of the third semiconductor layers is removed from the second gate trench. A first gate electrode is formed in the first gate trench. A second gate electrode is formed in the second gate trench.

In some embodiments, the forming of the first gate electrode includes forming a first concaved gate electrode end surface that protrudes inwardly along the first direction; and the forming of the second gate electrode includes forming a second concaved gate electrode end surface that protrudes outwardly along the first direction. In some embodiments, the forming of the first gate electrode includes forming the first gate electrode in contact with surfaces of the first inner spacers, and the forming of the second gate electrode includes forming the second gate electrode in contact with surfaces of the second pair of source/drain features.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a stack over a substrate, the stack including first semiconductor layers interleaved by second semiconductor layers;
    forming a first fin-shaped structure from the stack over a first area of the substrate;
    forming a second fin-shaped structure from the stack over a second area of the substrate;
    forming a dummy gate stack over the first fin-shaped structure and the second fin-shaped structure;
    depositing a first gate spacer layer over the substrate and the dummy gate stack;
    depositing a second gate spacer layer over the first gate spacer layer;
    after the depositing of the second gate spacer layer, forming a first source/drain trench over the first fin-shaped structure while the second fin-shaped structure is covered by a first mask layer;
    after the forming of the first source/drain trench, forming first inner spacer features to interleave the second semiconductor layers in the first area, while the second fin-shaped structure remains covered by the first mask layer;

forming a first source/drain feature in the first source/drain trench such that the first source/drain feature is in direct contact with the first and the second gate spacer layers;

forming a first etch stop layer over the first source/drain feature;

forming a second mask layer on the first etch stop layer;

after the forming of the second mask layer, removing the first mask layer;

after the removing of the first mask layer, forming a second source/drain trench over the second fin-shaped structure while the first fin-shaped structure is covered by the second mask layer;

forming second inner spacer features to interleave the second semiconductor layers in the second area, while the first fin-shaped structure remains covered by the second mask layer;

forming a second source/drain feature in the second source/drain trench;

forming a second etch stop layer over the second source/drain feature; and after the forming of the second etch stop layer, removing the second mask layer.

2. The method of claim 1, further comprising:
removing the dummy gate stack without substantially etching the first and second gate spacer layers, selectively removing the first semiconductor layers in the first area to release the second semiconductor layers as channel members; and
forming a gate structure to wrap around each of the channel members.

3. The method of claim 1, where a dielectric constant of the first inner spacer features is smaller than a dielectric constant of the second inner spacer features.

4. The method of claim 1,
wherein the forming of the first inner spacer features comprises:
selectively and partially etching sidewalls of the first semiconductor layers in the first area to form first inner spacer recesses,
depositing a first dielectric material over the first inner spacer recesses, and
etching back the first dielectric material to form the first inner spacer features in the first inner spacer recesses,
wherein the forming of second inner spacer features comprises:
selectively and partially etching sidewalls of the first semiconductor layers in the second area to form second inner spacer recesses,
depositing a second dielectric material over the second inner spacer recesses, and
etching back the second dielectric material to form the second inner spacer features in the second inner spacer recesses,
wherein the etching back of the first dielectric material comprises a first etch process different from a second etch process used in the etching back of the second dielectric material.

5. The method of claim 4,
wherein the first etch process comprises use of hydrogen peroxide and ammonium hydroxide and the second etch process comprises use of hydrochloric acid and hydrogen peroxide.

6. The method of claim 4,
wherein the first etch process comprises a wet etching method and the second etch process comprises a dry etching method.

7. The method of claim 1, wherein the forming of the first source/drain feature comprises:
epitaxially depositing a silicon germanium layer; and
in-situ doping a p-type dopant in the silicon germanium layer.

8. The method of claim 1, wherein the forming of the second source/drain feature comprises:
epitaxially depositing a silicon layer; and
in-situ doping an n-type dopant in the silicon layer.

9. The method of claim 1, further comprising:
after the removing of the second mask layer, depositing an interlayer dielectric (ILD) layer over the first etch stop layer and the second etch stop layer.

10. The method of claim 1, a ratio of a thickness of the first inner spacer features to a thickness of the second inner spacer features is between about 14 to about 1.1.

11. A method, comprising:
receiving a structure, wherein the structure includes:
a semiconductor substrate,
a first stack of first semiconductor layers and second semiconductor layers over the semiconductor substrate, wherein the first semiconductor layers and the second semiconductor layers have different material compositions and alternate with one another within the first stack,
a second stack of third semiconductor layers and fourth semiconductor layers over the semiconductor substrate, wherein the third semiconductor layers and the fourth semiconductor layers have different material compositions and alternate with one another within the second stack, and
a first dummy gate structure over the first stack and a second dummy gate structure over the second stack,
depositing a first gate spacer layer over the semiconductor substrate and the first dummy gate structure;
depositing a second gate spacer layer over the first gate spacer layer;
removing a first portion of the first stack on two sides of the first dummy gate structure to form a first pair of source/drain trenches that extend into the semiconductor substrate, thereby exposing a pair of first side surfaces of the first stack;
removing a first portion of the first semiconductor layers from the exposed pair of first side surfaces to form first gaps;
forming a first inner spacer in the first gaps, wherein the first inner spacer has a first dimension along a direction connecting the first pair of source/drain trenches;
after the forming the first inner spacer, epitaxially growing a first pair of source/drain features in the first pair of source/drain trenches such that the first pair of source/drain features are in direct contact with the first and second gate spacer layers, wherein a portion of one of the first pair of source/drain features is disposed vertically between two adjacent layers of the second semiconductor layers;
after the growing of the first pair of source/drain features in the first pair of source/drain trenches, removing a first portion of the second stack on two sides of the second dummy gate structure to form a second pair of source/drain trenches, thereby exposing a pair of second side surfaces of the second stack;

removing a first portion of the third semiconductor layers from the exposed pair of second side surfaces to form second gaps;

forming a second inner spacer in the second gaps, wherein the second inner spacer has a second dimension along a direction connecting the second pair of source/drain trenches, the second dimension being different from the first dimension;

epitaxially growing a second pair of source/drain features in the second pair of source/drain trenches;

removing the first and the second dummy gate structures to form a first gate trench over the first stack and a second gate trench over the second stack, respectively;

removing a second portion of the first semiconductor layers from the first gate trench;

removing a second portion of the third semiconductor layers from the second gate trench;

forming a first gate electrode in the first gate trench; and forming a second gate electrode in the second gate trench.

12. The method of claim 11, wherein:
the epitaxially growing of the first pair of source/drain features includes epitaxially growing the first pair of source/drain features and doping the first pair of source/drain features with an n-type dopant;
the epitaxially growing of the second pair of source/drain features includes epitaxially growing the second pair of source/drain features and doping the second pair of source/drain features with a p-type dopant; and
the forming of the second inner spacer includes forming the second inner spacer with the second dimension larger than the first dimension.

13. The method of claim 11, wherein the removing of the first portion of the first semiconductor layers includes removing with a first etching method, and the removing of the first portion of the third semiconductor layers includes removing with a second etching method, and the second etching method differs from the first etching method.

14. The method of claim 11, wherein the forming of the second inner spacer includes forming the second inner spacer with a material different from a material of the first inner spacer.

15. The method of claim 11, wherein the forming of the second inner spacer includes forming the second inner spacer with a surface profile different from a surface profile of the first inner spacer.

16. The method of claim 11, wherein:
the epitaxially growing of the first pair of source/drain features includes growing on a first interface between the first inner spacer and a layer of the first semiconductor layers such that one of the first pair of source/drain features directly contacts the first interface; and
the epitaxially growing of the second pair of source/drain features includes growing on a second interface between the second inner spacer and a layer of the third semiconductor layers such that one of the second pair of source/drain features directly contacts the second interface.

17. The method of claim 11, wherein the forming of the first gate electrode includes forming the first gate electrode in contact with surfaces of the first inner spacer, and the forming of the second gate electrode includes forming the second gate electrode in contact with surfaces of the second inner spacer.

18. A method, comprising:
receiving a structure, wherein the structure includes:
a semiconductor substrate,
a first stack of first semiconductor layers and second semiconductor layers over the semiconductor substrate, wherein the first semiconductor layers and the second semiconductor layers have different material compositions and alternate with one another within the first stack,
a second stack of third semiconductor layers and fourth semiconductor layers over the semiconductor substrate, wherein the third semiconductor layers and the fourth semiconductor layers have different material compositions and alternate with one another within the second stack, and
a first dummy gate structure over the first stack and a second dummy gate structure over the second stack;
depositing a gate spacer layer over the semiconductor substrate, the first dummy gate structure and the second dummy gate structure;
removing a first portion of the first stack on two sides of the first dummy gate structure to form a first pair of source/drain trenches that extend into the semiconductor substrate while the second stack and the second dummy gate structure are covered by a first mask layer, thereby exposing a pair of first side surfaces of the first stack;
removing a first portion of the first semiconductor layers from the exposed pair of first side surfaces to form first gaps;
depositing a first dielectric material over the first gaps and sidewalls of the gate spacer layer;
etching back the first dielectric material using the gate spacer layer as a masking element to form first inner spacers in the first gaps, wherein the first inner spacers each has a first dimension along a first direction connecting the first pair of source/drain trenches;
epitaxially growing a first pair of source/drain features in the first pair of source/drain trenches, such that the first pair of source/drain features each directly contacts with the gate spacer layer and one of the first inner spacers;
forming a first etch stop layer extending over the first pair of source/drain features;
removing the first mask layer;
removing a first portion of the second stack on two sides of the second dummy gate structure to form a second pair of source/drain trenches while the first dummy gate structure and the first pair of source/drain features are covered by a second mask layer, thereby exposing a pair of second side surfaces of the second stack;
removing a first portion of the third semiconductor layers from the exposed pair of second side surfaces to form second gaps;
depositing a second dielectric material over the second gaps and sidewalls of the gate spacer layer;
etching back the second dielectric material using the gate spacer layer as a masking element to form second inner spacers in the second gaps having a second dimension along the first direction;
epitaxially growing a second pair of source/drain features in the second pair of source/drain trenches, such that the second pair of source/drain features each directly contacts with the second inner spacers;
after the forming of the first etch stop layer and the second pair of source/drain features, forming a second etch stop layer extending over the second pair of source/drain features;

removing the second mask layer;

removing the first and the second dummy gate structures to form a first gate trench over the first stack and a second gate trench over the second stack, respectively;

removing a second portion of the first semiconductor layers from the first gate trench;

removing the second portion of the third semiconductor layers from the second gate trench;

forming a first gate electrode in the first gate trench; and forming a second gate electrode in the second gate trench.

19. The method of claim 18, further comprising, after the removing of the second mask layer, forming an interlayer dielectric (ILD) layer over the first etch stop layer and the second etch stop layer.

20. The method of claim 19, wherein a planarization technique is applied to remove excess ILD layer.

\* \* \* \* \*